United States Patent
Dai et al.

(10) Patent No.: US 12,165,584 B2
(45) Date of Patent: Dec. 10, 2024

(54) DISPLAY SUBSTRATE AND PREPARATION METHOD THEREOF, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Junxiu Dai, Beijing (CN); Lu Bai, Beijing (CN)

(73) Assignees: Beijing BOE Technology Development Co., Ltd., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 0 days.

(21) Appl. No.: 17/912,061

(22) PCT Filed: Nov. 8, 2021

(86) PCT No.: PCT/CN2021/129212
§ 371 (c)(1),
(2) Date: Nov. 3, 2022

(87) PCT Pub. No.: WO2022/227478
PCT Pub. Date: Nov. 3, 2022

(65) Prior Publication Data
US 2024/0212602 A1    Jun. 27, 2024

(30) Foreign Application Priority Data

Apr. 29, 2021 (CN) .......................... 202110476854.7

(51) Int. Cl.
*G09G 3/3233* (2016.01)
*H10K 59/12* (2023.01)
(Continued)

(52) U.S. Cl.
CPC ....... *G09G 3/3233* (2013.01); *H10K 59/1201* (2023.02); *H10K 59/1213* (2023.02);
(Continued)

(58) Field of Classification Search
CPC ......... G09G 3/3233; G09G 2310/0286; G09G 2310/08; G09G 3/3208; H10K 59/1201;
(Continued)

(56) References Cited

U.S. PATENT DOCUMENTS 8,704,807 B2 * 4/2014 Chung ................. G09G 3/3266
                                                    345/204
10,847,093 B2 * 11/2020 In ......................... H10K 59/131
(Continued)

FOREIGN PATENT DOCUMENTS

CN        102959604 A      3/2013
CN        102959605 A      3/2013
(Continued)

OTHER PUBLICATIONS

International Search Report for PCT/CN2021/129212 Mailed Jan. 29, 2022.

*Primary Examiner* — Amit Chatly
(74) *Attorney, Agent, or Firm* — Ling Wu; Stephen Yang; Ling and Yang Intellectual Property

(57)    ABSTRACT

Provided are a display substrate and a preparation method thereof, and a display apparatus. The display substrate includes an underlay substrate, and a drive circuit and a first power supply line disposed on the underlay substrate, the drive circuit at least includes a first capacitor, a second capacitor, and a third capacitor; the first capacitor and the third capacitor are arranged along a first direction, the second capacitor and the third capacitor are respectively located on both sides of the first capacitor, the second capacitor is located on one side of the first capacitor close to
(Continued)

a display region, and one electrode plate of the third capacitor is electrically connected with the first power supply line; an orthographic projection of the first capacitor on the underlay substrate is at least partially overlapped with an orthographic projection of the first power supply line on the underlay substrate.

19 Claims, 15 Drawing Sheets

(51) Int. Cl.
*H10K 59/121* (2023.01)
*H10K 59/131* (2023.01)

(52) U.S. Cl.
CPC ....... *H10K 59/1216* (2023.02); *H10K 59/131* (2023.02); *G09G 2310/0286* (2013.01); *G09G 2310/08* (2013.01)

(58) Field of Classification Search
CPC ........... H10K 59/1213; H10K 59/1216; H10K 59/131

See application file for complete search history.

(56) References Cited

U.S. PATENT DOCUMENTS

| | | | |
|---|---|---|---|
| 2011/0298694 A1* | 12/2011 | Nieh | G09G 3/30 345/76 |
| 2012/0326176 A1* | 12/2012 | Shirouzu | H01L 27/1255 438/4 |
| 2012/0326177 A1 | 12/2012 | Shirouzu et al. | |
| 2018/0182302 A1* | 6/2018 | Yoo | H10K 59/1213 |
| 2020/0119126 A1 | 4/2020 | Jo et al. | |
| 2020/0135120 A1* | 4/2020 | Seo | G06F 1/1683 |
| 2022/0068212 A1 | 3/2022 | Yao et al. | |
| 2022/0093047 A1* | 3/2022 | Zhang | G09G 3/3266 |
| 2022/0310184 A1 | 9/2022 | Zhang et al. | |
| 2022/0406252 A1* | 12/2022 | Feng | G09G 3/3233 |
| 2023/0021680 A1 | 1/2023 | Li et al. | |

FOREIGN PATENT DOCUMENTS

| | | |
|---|---|---|
| CN | 106920825 A | 7/2017 |
| CN | 108630144 A | 10/2018 |
| CN | 110426900 A | 11/2019 |
| CN | 111029366 A | 4/2020 |
| CN | 111243650 A | 6/2020 |
| CN | 111540313 A | 8/2020 |
| CN | 111816691 A | 10/2020 |
| CN | 112071882 A | 12/2020 |
| CN | 113241040 A | 8/2021 |
| CN | 113920937 A | 1/2022 |

\* cited by examiner

… (1)

DISPLAY SUBSTRATE AND PREPARATION METHOD THEREOF, AND DISPLAY APPARATUS

CROSS-REFERENCE TO RELATED APPLICATIONS

The present application is a U.S. National Phase Entry of International Application No. PCT/CN2021/129212 having an international filing date of Nov. 8, 2021, which claims priority to Chinese Patent Application No. 202110476854.7 filed to the CNIPA on Apr. 29, 2021 and entitled "Display Substrate and Preparation Method thereof, and Display Apparatus". The entire contents of the above-identified applications are hereby incorporated into the present application by reference.

TECHNICAL FIELD

Embodiments of the present disclosure relate to, but are not limited to, the field of display technologies, and particularly, to a display substrate and a preparation method thereof, and a display apparatus.

BACKGROUND

An Organic Light Emitting Diode (OLED) display apparatus has ultra-thinness, a large viewing angle, active light emission, high brightness, continuously adjustable color of emitted light, a low cost, a fast response speed, low power consumption, a wide operating temperature range, flexible display, and other advantages, and has gradually become a next generation display technology with great development prospects. A drive circuit is an important auxiliary circuit in the OLED.

With continuous development of display technologies, a large "screen-to-body ratio (i.e., a ratio of an area of an actual display region to a total area of a display side)" has become one of appearance characteristics pursued by display apparatuses. Especially for a wearable display apparatus (such as a smart watch), based on considerations of portability and viewing angle effects, an extreme-narrow bezel or even full-screen display has become an important trend in development.

SUMMARY

The following is a summary of subject matters described herein in detail. The summary is not intended to limit the protection scope of claims.

In a first aspect, the present disclosure provides a display substrate, including a display region and a non-display region, and including an underlay substrate, and a drive circuit and a first power supply line which are disposed on the underlay substrate and located in the non-display region, wherein the drive circuit at least includes a first capacitor, a second capacitor, and a third capacitor; the first capacitor and the third capacitor are arranged along a first direction, the second capacitor and the third capacitor are respectively located on both sides of the first capacitor, the second capacitor is located on one side of the first capacitor close to the display region, and one electrode plate of the third capacitor is electrically connected with the first power supply line; the first power supply line extends along the first direction, and an orthographic projection of the first capacitor on the underlay substrate is at least partially overlapped with an orthographic projection of the first power supply line on the underlay substrate.

In some possible implementation modes, an orthographic projection of the third capacitor on the underlay substrate is at least partially overlapped with the orthographic projection of the first power supply line on the underlay substrate.

In some possible implementation modes, the display substrate further includes: a second power supply line, an initial signal line, a first clock signal line, and a second clock signal line which are disposed on the underlay substrate and located in the non-display region; the second power supply line is located on one side of the drive circuit close to the display region and extends along the first direction, the initial signal line is located on one side of the first power supply line away from the display region and extends along the first direction, the first clock signal line is located between the first power supply line and the initial signal line and extends along the first direction, and the second clock signal line is located between the first clock signal line and the initial signal line and extends along the first direction; and a width of the second power supply line is less than or equal to a width of the first power supply line, and/or a width of the initial signal line is less than a width of the first power supply line, and/or a width of the first clock signal line is less than the width of the first power supply line and greater than the width of the initial signal line, and/or a width of the second clock signal line is less than the width of the first power supply line and greater than the width of the initial signal line.

In some possible implementation modes, the drive circuit includes multiple shift registers arranged along the first direction, wherein each shift register includes a first transistor to a tenth transistor, a first capacitor to a third capacitor, a signal input terminal, a signal output terminal, a first clock signal terminal, a second clock signal terminal, a first power supply terminal, and a second power supply terminal; a gate electrode of the first transistor is electrically connected with the first clock signal terminal, a source electrode of the first transistor is electrically connected with the signal input terminal, and a drain electrode of the first transistor is electrically connected with a first node; a gate electrode of the second transistor is electrically connected with the first node, a source electrode of the second transistor is electrically connected with the first clock signal terminal, and a second electrode of the second transistor is electrically connected with a second node; a gate electrode of the third transistor is electrically connected with the first clock signal terminal, a source electrode of the third transistor is electrically connected with the second power supply terminal, and a second electrode of the third transistor is electrically connected with the second node; a gate electrode of the fourth transistor is electrically connected with the second clock signal terminal, a source electrode of the fourth transistor is electrically connected with the first node, and a drain electrode of the fourth transistor is electrically connected with a source electrode of the fifth transistor; a gate electrode of the fifth transistor is electrically connected with the second node, and a drain electrode of the fifth transistor is electrically connected with the first power supply terminal; a gate electrode of the sixth transistor is electrically connected with the second node, a source electrode of the sixth transistor is electrically connected with the second clock signal terminal, and a drain electrode of the sixth transistor is electrically connected with a third node; a gate electrode of the seventh transistor is electrically connected with the second clock signal terminal, a source electrode of the seventh transistor is electrically connected with the third node, and a drain electrode of the seventh transistor is electrically connected with a fourth node; a gate electrode of the eighth transistor is electrically connected with the first node, a source electrode of the eighth transistor is electrically connected with the first power supply terminal, and a drain electrode of the eighth transistor is electrically connected with the fourth node; a gate electrode of the ninth transistor is electrically connected with the fourth node, a source electrode of the ninth transistor is electrically connected with the signal output terminal, and a drain electrode of the ninth transistor is electrically connected with the first power supply terminal; a gate electrode of the tenth transistor is electrically connected with the first node, a source electrode of the tenth transistor is electrically connected with the second power supply terminal, and a drain electrode of the tenth transistor is electrically connected with the signal output terminal; a first electrode plate of the first capacitor is electrically connected with the second node, and a second electrode plate of the first capacitor is electrically connected with the third node; a first electrode plate of the second capacitor is electrically connected with the first node, and a second electrode plate of the second capacitor is electrically connected with the second clock signal terminal; a first electrode plate of the third capacitor is electrically connected with the fourth node, and a second electrode plate of the third capacitor is electrically connected with the first power supply terminal.

In some possible implementation modes, the first electrode plate of the first capacitor is located on one side of the second electrode plate of the first capacitor close to the underlay substrate, and an orthographic projection of the first electrode plate of the first capacitor on the underlay substrate covers an orthographic projection of the second electrode plate of the first capacitor on the underlay substrate; the first electrode plate of the second capacitor is located on one side of the second electrode plate of the second capacitor close to the underlay substrate, and an orthographic projection of the first electrode plate of the second capacitor on the underlay substrate covers an orthographic projection of the second electrode plate of the second capacitor on the underlay substrate; the first electrode plate of the third capacitor is located on one side of the second electrode plate of the third capacitor close to the underlay substrate, and an orthographic projection of the first electrode plate of the third capacitor on the underlay substrate covers an orthographic projection of the second electrode plate of the third capacitor on the underlay substrate; wherein an area of an overlapping portion of the first electrode plate of the first capacitor and the first power supply line is positively related to an area of the first electrode plate of the first capacitor, and an area of an overlapping portion of the first electrode plate of the third capacitor and the first power supply line is positively related to an area of the first electrode plate of the third capacitor; and the area of the overlapping portion of the first electrode plate of the first capacitor and the first power supply line is smaller than the area of the overlapping portion of the first electrode plate of the third capacitor and the first power supply line.

In some possible implementation modes, the multiple shift registers in the drive circuit are cascaded, a signal input terminal of a first-stage shift register is electrically connected with the initial signal line, a signal output terminal of an (i−1)th-stage shift register is electrically connected with a signal input terminal of an ith-stage shift register, first power supply terminals of all shift registers are electrically connected with the first power supply line, second power supply terminals of the shift registers are electrically connected with the second power supply line, a first clock signal terminal of an odd-stage shift register is electrically connected with the first clock signal line, a second clock signal terminal of the odd-stage shift register is electrically connected with the second clock signal line, a first clock signal terminal of an even-stage shift register is electrically connected with the second clock signal line, a second clock signal terminal of the even-stage shift register is electrically connected with the first clock signal line, wherein i is a positive integer greater than or equal to 2.

In some possible implementation modes, the display substrate further includes sub-pixels arranged in array, disposed on the underlay substrate, and located in the display region; a signal output terminal of the ith-stage shift register is electrically connected with sub-pixels in a (2i−1)th row and sub-pixels in a (2i)th row.

In some possible implementation modes, each shift register includes a connection electrode and an output signal line disposed in different layers; the output signal line is electrically connected with a signal output terminal of a shift register of a present stage, and an orthographic projection of the connection electrode on the underlay substrate is at least partially overlapped with an orthographic projection of the output signal line on the underlay substrate; and the connection electrode is electrically connected with the signal output terminal of the shift register of the present stage and a signal input terminal of a shift register of a next stage respectively.

In some possible implementation modes, the display substrate includes a semiconductor layer, a first insulation layer, a first metal layer, a second insulation layer, a second metal layer, a third insulation layer, and a third metal layer which are sequentially stacked on the underlay substrate; the semiconductor layer includes active layers of multiple transistors, the first metal layer includes gate electrodes of the multiple transistors, the first electrode plate of the first capacitor, the first electrode plate of the second capacitor, and the first electrode plate of the third capacitor, the second metal layer includes the second electrode plate of the first capacitor, the second electrode plate of the second capacitor, the second electrode plate of the third capacitor, and the output signal line, the third metal layer includes source electrodes of the multiple transistors, drain electrodes of the multiple transistors, the first power supply line, the second power supply line, the first clock signal line, the second clock signal line, the initial signal line, and the connection electrode; a resistance of the third metal layer is less than a resistance of the first metal layer and less than a resistance of the second metal layer.

In some possible implementation modes, in each shift register, active layers of all transistors include a channel region, and a source connection portion and a drain connection portion located on both sides of the channel region, wherein a source electrode of a transistor is electrically connected with the source connection portion, and a drain electrode of the transistor is electrically connected with the drain connection portion; a drain connection portion of an active layer of the fourth transistor is multiplexed as a drain electrode, a source connection portion of an active layer of the fifth transistor is multiplexed as a source electrode, and the drain connection portion of the active layer of the fourth transistor is electrically connected with the source connection portion of the active layer of the fifth transistor.

In some possible implementation modes, in each shift register, the gate electrode of the second transistor, the gate electrode of the tenth transistor, the gate electrode of the eighth transistor, and the first electrode plate of the second capacitor are of an integrally formed structure, the gate electrode of the fifth transistor, the gate electrode of the sixth transistor, and the first electrode plate of the first capacitor are of an integrally formed structure, and the gate electrode of the ninth transistor and the first electrode plate of the third capacitor are of an integrally formed structure; the drain electrode of the first transistor and the source electrode of the fourth transistor are of an integrally formed structure, the drain electrode of the second transistor and the drain electrode of the third transistor are of an integrally formed structure, the source electrode of the third transistor, the source electrode of the tenth transistor, and the second power supply line are of an integrally formed structure, the drain electrode of the sixth transistor and the source electrode of the seventh transistor are of an integrally formed structure, the drain electrode of the seventh transistor and the drain electrode of the eighth transistor are of an integrally formed structure, and the source electrode of the eighth transistor, the drain electrode of the ninth transistor, the drain electrode of the fifth transistor, and the first power supply line are of an integrally formed structure.

In some possible implementation modes, the first transistor, the second transistor, the third transistor, the fourth transistor, and the fifth transistor are located on one side of the first capacitor away from the third capacitor and on one side of the second capacitor close to the first power supply line; the sixth transistor is located on one side of the first capacitor close to the second power supply line and on one side of the second capacitor close to the third capacitor, the seventh transistor and the eighth transistor are located between the first capacitor and the third capacitor, and the ninth transistor and the tenth transistor are located on one side of the second capacitor close to the second power supply line.

In some possible implementation modes, in each shift register, active layers of the first transistor, the second transistor, the third transistor, the fourth transistor, the fifth transistor, the sixth transistor, the seventh transistor, the ninth transistor, and the tenth transistor extend along the first direction, an active layer of the eighth transistor extends along a second direction, and the source electrode and the drain electrode of the sixth transistor are arranged along the first direction; and the first direction intersects with the second direction.

In some possible implementation modes, a distance between the first power supply line and an edge of the first capacitor close to the second power supply line is less than a distance between the first power supply line and the source electrode of the sixth transistor.

In some possible implementation modes, the output signal line in each shift register includes a first connection portion, a second connection portion, a third connection portion, and a fourth connection portion which are integrally formed; an orthographic projection of the first connection portion on the underlay substrate is at least partially overlapped with an orthographic projection of the source electrode of the ninth transistor on the underlay substrate and is at least partially overlapped with an orthographic projection of the drain electrode of the tenth transistor on the underlay substrate, and the first connection portion extends along the first direction; the second connection portion, the third connection portion, and the fourth connection portion extend along the second direction, the second connection portion and the third connection portion are located on one side of the first connection portion away from the first power supply line, and the fourth connection portion is located on one side of the first connection portion close to the first power supply line; the second connection portion is electrically connected with the sub-pixels in the (2i−1)th row, and the third connection portion is electrically connected with the sub-pixels in the (2i)th row; the fourth connection portion is electrically connected with the signal input terminal of the shift register of the next stage; an orthographic projection of the connection electrode on the underlay substrate is at least partially overlapped with an orthographic projection of the fourth connection portion on the underlay substrate, and the fourth connection portion is electrically connected with the signal input terminal of the shift register of the next stage through the connection electrode.

In some possible implementation modes, for each shift register, the display substrate further includes a first via to a tenth via penetrating the first insulation layer, the second insulation layer, and the third insulation layer; the first via exposes an active layer of the first transistor, the second via exposes an active layer of the second transistor, the third via exposes an active layer of the third transistor, the fourth via exposes an active layer of the fourth transistor, the fifth via exposes an active layer of the fifth transistor, the sixth via exposes an active layer of the sixth transistor, the seventh via exposes an active layer of the seventh transistor, the eighth via exposes an active layer of the eighth transistor, the ninth via exposes an active layer of the ninth transistor, and the tenth via exposes an active layer of the tenth transistor; the source electrode and the drain electrode of the first transistor are electrically connected with the active layer of the first transistor through the first via, the source electrode and the drain electrode of the second transistor are electrically connected with the active layer of the second transistor through the second via, the source electrode and the drain electrode of the third transistor are electrically connected with the active layer of the third transistor through the third via, the source electrode and the drain electrode of the fourth transistor are electrically connected with the active layer of the fourth transistor through the fourth via, the source electrode and the drain electrode of the fifth transistor are electrically connected with the active layer of the fifth transistor through the fifth via, the source electrode and the drain electrode of the sixth transistor are electrically connected with the active layer of the sixth transistor through the sixth via, the source electrode and the drain electrode of the seventh transistor are electrically connected with the active layer of the seventh transistor through the seventh via, the source electrode and the drain electrode of the eighth transistor are electrically connected with the active layer of the eighth transistor through the eighth via, the source electrode and the drain electrode of the ninth transistor are electrically connected with the active layer of the ninth transistor through the ninth via, and the source electrode and the drain electrode of the tenth transistor are electrically connected with the active layer of the tenth transistor through the tenth via.

In some possible implementation modes, the display substrate further includes an eleventh via to a sixteenth via penetrating the second insulation layer and the third insulation layer; the eleventh via exposes the gate electrode of the first transistor, the twelfth via exposes the gate electrode of the second transistor, the thirteenth via exposes the gate electrode of the fourth transistor, the fourteenth via exposes the gate electrode of the fifth transistor, and the sixteenth via exposes the first electrode plate of the third capacitor; the source electrode of the second transistor is electrically connected with the gate electrode of the first transistor through the eleventh via, the drain electrode of the first transistor is electrically connected with the gate electrode of the second transistor through the twelfth via, the source electrode of the sixth transistor is electrically connected with the gate electrode of the fourth transistor through the thirteenth via, the drain electrode of the third transistor is electrically connected with the gate electrode of the fifth transistor through the fourteenth via, and the drain electrode of the seventh transistor is electrically connected with the first electrode plate of the third capacitor through the sixteenth via.

In some possible implementation modes, the display substrate further includes a seventeenth via to a twenty-first via disposed on the third insulation layer; the seventeenth via exposes the second electrode plate of the first capacitor, the eighteenth via exposes the second electrode plate of the second capacitor, the nineteenth via exposes the second electrode plate of the third capacitor, the twentieth via exposes a first connection portion of the output signal line, and the twenty-first via exposes a fourth connection portion of the output signal line; the drain electrode of the sixth transistor is electrically connected with the second electrode plate of the first capacitor through the seventeenth via, the source electrode of the sixth transistor is electrically connected with the second electrode plate of the second capacitor through the eighteenth via, the drain electrode of the ninth transistor is electrically connected with the second electrode plate of the third capacitor through the nineteenth via, the source electrode of the ninth transistor and the drain electrode of the tenth transistor are electrically connected with the signal output terminal through the twentieth via, and the connection electrode is electrically connected with the signal output terminal through the twenty-first via; a quantity of seventeenth vias is multiple, and the multiple seventeenth vias are arranged along the first direction; a quantity of eighteenth vias is multiple, and the multiple eighteenth vias are arranged along the first direction; a quantity of nineteenth vias is multiple, and the multiple nineteenth vias are arranged along the second direction; a quantity of twentieth vias is multiple, and the multiple twentieth vias are arranged along the first direction.

In a second aspect, the present disclosure also provides a display apparatus, including the above display substrate.

In a third aspect, the present disclosure further provides a preparation method of a display substrate, which is configured to prepare the above display substrate. The method includes: providing an underlay substrate; and forming a drive circuit and a first power supply line located in a non-display region on the underlay substrate; wherein the drive circuit includes a first capacitor, a second capacitor, and a third capacitor; the first capacitor and the third capacitor are arranged along a first direction, the second capacitor and the third capacitor are respectively located on both sides of the first capacitor, the second capacitor is located on one side of the first capacitor close to a display region, and one electrode plate of the third capacitor is electrically connected with the first power supply line; the first power supply line extends along the first direction, and an orthographic projection of the first capacitor on the underlay substrate is at least partially overlapped with an orthographic projection of the first power supply line on the underlay substrate.

In some possible implementation modes, the drive circuit includes multiple shift registers, wherein each shift register includes multiple transistors and a first capacitor to a third capacitor, and the forming the drive circuit and the first power supply line located in the non-display region on the underlay substrate includes: forming a semiconductor layer on the underlay substrate, wherein the semiconductor layer includes active layers of multiple transistors; sequentially forming a first insulation layer and a first metal layer on the semiconductor layer, wherein the first metal layer includes gate electrodes of the multiple transistors, a first electrode plate of the first capacitor, a first electrode plate of the second capacitor, and a first electrode plate of the third capacitor; sequentially forming a second insulation layer and a second metal layer on the first metal layer, wherein the second metal layer includes a second electrode plate of the first capacitor, a second electrode plate of the second capacitor, a second electrode plate of the third capacitor, and an output signal line; and sequentially forming a third insulation layer and a third metal layer on the second metal layer, wherein the third metal layer includes source electrodes of the multiple transistors, drain electrodes of the multiple transistors, the first power supply line, a second power supply line, a first clock signal line, a second clock signal line, an initial signal line, and a connection electrode.

Other aspects may be understood upon reading and understanding drawings and detailed description.

BRIEF DESCRIPTION OF DRAWINGS

The accompanying drawings are used for providing understanding of technical solutions of the present disclosure, constitute a part of the specification, and are used for explaining the technical solutions of the present disclosure together with the embodiments of the present disclosure, but do not constitute a limitation on the technical solutions of the present disclosure.

DETAILED DESCRIPTION

Figure 1:
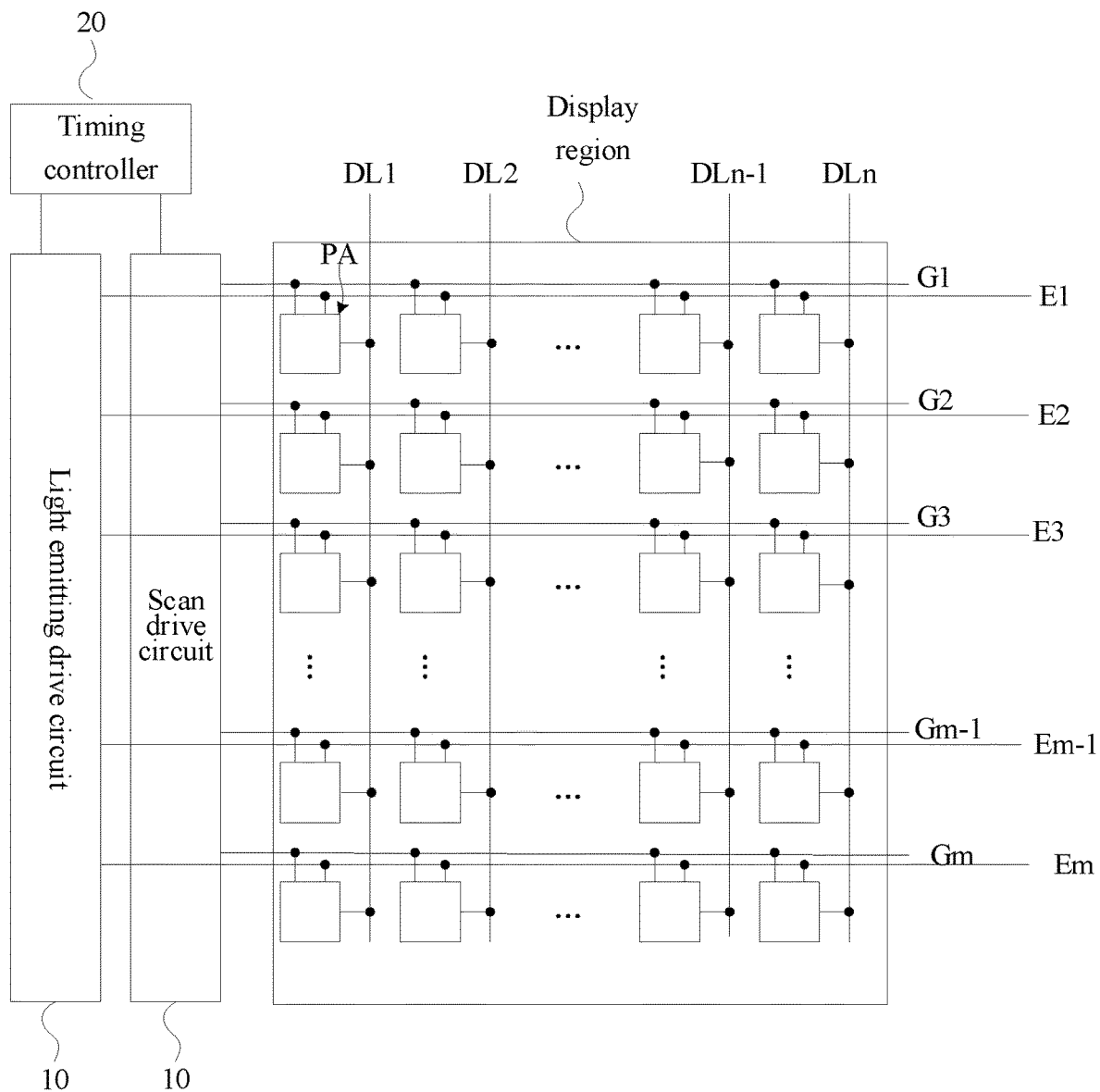
FIG. 1 is a schematic diagram of a structure of a display substrate according to an embodiment of the present disclosure.

In order to make objectives, technical solutions, and advantages of the present disclosure clearer, the embodiments of the present disclosure will be described in detail with reference to the accompanying drawings. It is to be noted that implementation modes may be implemented in multiple different forms. Those of ordinary skills in the art may easily understand such a fact that modes and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other without conflict.

In the drawings, a size of each constituent element, a thickness of a layer, or a region is exaggerated sometimes for clarity. Therefore, one mode of the present disclosure is not necessarily limited to the size, and shapes and sizes of various components in the drawings do not reflect actual scales. In addition, the drawings schematically illustrate ideal examples, and one mode of the present disclosure is not limited to shapes, numerical values, or the like shown in the drawings.

Ordinal numerals such as "first", "second", and "third" in the specification are set to avoid confusion of constituent elements, but not to set a limit in quantity.

In the specification, for convenience, wordings indicating directional or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection. It may be a mechanical connection or an electrical connection. It may be a direct mutual connection, or an indirect connection through middleware, or internal communication between two elements. Those of ordinary skill in the art may understand specific meanings of these terms in the present disclosure according to specific situations.

In the specification, an "electrical connection" includes a case that constituent elements are connected together through an element with some electrical effect. The "element with some electrical effect" is not particularly limited as long as electrical signals may be sent and received between the connected constituent elements. Examples of the "element with some electrical effect" not only include electrodes and wirings, but also include switching elements such as transistors, resistors, inductors, capacitors, other elements with various functions, etc.

Those skilled in the art may understand that a transistor employed in all embodiments of the present disclosure may be a thin film transistor or a field effect transistor or another device having same characteristics. The thin film transistor may be an oxide semiconductor thin film transistor, a low temperature poly silicon thin film transistor, an amorphous silicon thin film transistor, or a microcrystalline silicon thin film transistor. A thin film transistor with a bottom gate structure or a thin film transistor with a top gate structure may be specifically selected as the thin film transistor, as long as they can achieve a switching function. Since a source and a drain of the transistor used here are symmetric, the drain and the source thereof may be interchanged.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulation film" may be replaced with an "insulation layer" sometimes.

In the present disclosure, "about" refers to that a boundary is defined not so strictly and numerical values within process and measurement error ranges are allowed.

Figure 2:
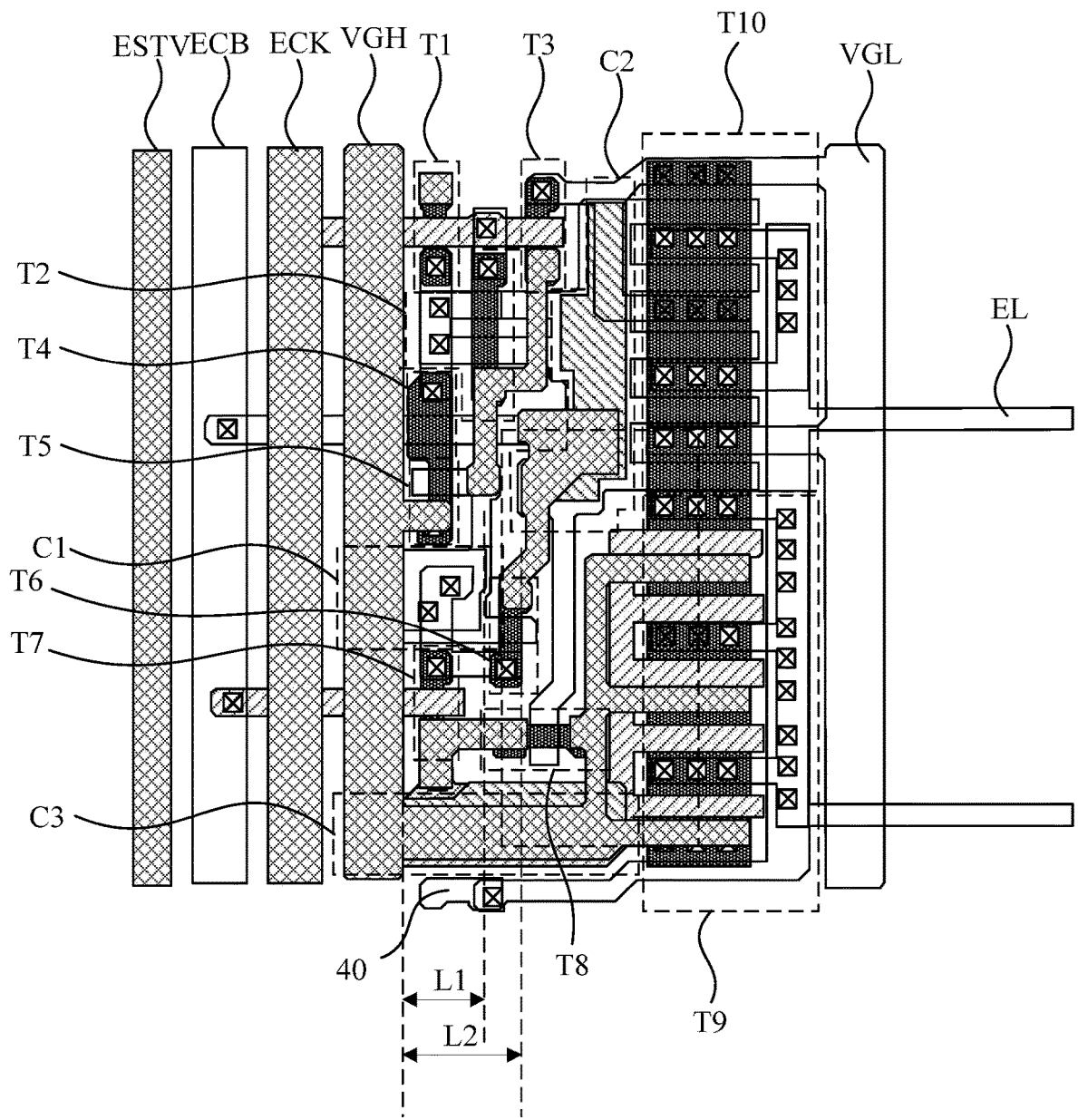
FIG. 2 is a top view of a drive circuit according to an embodiment of the present disclosure.

FIG. 1 is a schematic diagram of a structure of a display substrate according to an embodiment of the present disclosure, and FIG. 2 is a top view of a drive circuit according to an embodiment of the present disclosure. As shown in FIG. 1 and FIG. 2, the display substrate according to the embodiment of the present disclosure may include: a display region and a non-display region located at a periphery of the display region. The display substrate may include an underlay substrate, and a drive circuit 10 and a first power supply line VGH which are disposed on the underlay substrate and located in the non-display region, and the drive circuit at least may include a first capacitor C1, a second capacitor C2, and a third capacitor C3. The first capacitor C1 and the third capacitor C3 are arranged along a first direction, the second capacitor C2 and the third capacitor C3 are respectively located on both sides of the first capacitor C1, the second capacitor C2 is located on one side of the first capacitor C1 close to the display region, and one electrode plate of the third capacitor C3 is electrically connected with the first power supply line VGH.

The first power supply line VGH extends along the first direction. An orthographic projection of the first capacitor C1 on the underlay substrate is at least partially overlapped with an orthographic projection of the first power supply line VGH on the underlay substrate.

In an exemplary embodiment, the underlay substrate may be a rigid base substrate or a flexible base substrate, wherein the rigid base substrate may be, but is not limited to, one or more of glass and metal foil; the flexible base substrate may be, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers.

In an exemplary embodiment, the first power supply line VGH may be located on one side of the second capacitor C2 away from the display region.

In an exemplary embodiment, the first power supply line VGH may continuously provide a direct current signal with a high level.

In an exemplary embodiment, a width of the first power supply line VGH may be about 6 microns to 12 microns.

In an exemplary embodiment, quantities of first capacitors C1, second capacitors C2, and third capacitors C3 are multiple, and are determined according to an actual requirement of the display substrate, which is not limited in the present disclosure.

In an exemplary embodiment, the display region may be provided with multiple sub-pixels PA arranged regularly, multiple first signal lines (including, for example, a scan line G, a control signal line, and a light emitting control line E) extending along a second direction, and multiple second signal lines (including, for example, a data line DL) extending along the first direction.

In an exemplary embodiment, at least one first signal line may extend along the second direction, and multiple first signal lines may be sequentially arranged along the first direction. At least one second signal line may extend along the first direction, and multiple second signal lines may be sequentially arranged along the second direction.

In an exemplary embodiment, at least one sub-pixel PA in the multiple sub-pixels may include: a light emitting element and a pixel drive circuit for driving the light emitting element to emit light. A design of 3T1C, 5T1C, or 7T1C may be adopted for the pixel drive circuit.

In an exemplary embodiment, intersection of the first direction and the second direction means that an included angle between the first direction and the second direction is about 70 degrees to 90 degrees. The first direction and the second direction may be located in a same plane. For example, the first direction may be a row direction, which is parallel to an extension direction of a scan line; and the second direction may be a column direction, which is parallel to an extension direction of a data line.

In some exemplary embodiments, as shown in FIG. 1, m rows of scan lines G1 to Gm are disposed along the first direction, m rows of light emitting signal lines E1 to Em are disposed along the first direction, and n columns of data lines DL1 to DLn are disposed along the second direction. The scan lines and the data lines are insulated from each other, and the light emitting signal lines and the data lines are insulated from each other. Herein, both m and n are integers greater than 0. Sub-pixels PA may be distributed at intersecting positions of m rows of scan lines and n columns of data lines. The multiple sub-pixels PA are regularly arranged in a matrix shape.

In an exemplary embodiment, a sub-pixel may be any one of a red (R) sub-pixel, a green (G) sub-pixel, a blue (B) sub-pixel, and a white sub-pixel, which is not limited in the present disclosure. When a red (R) sub-pixel, a green (G) sub-pixel, and a blue (B) sub-pixel are included in a display panel, the three sub-pixels may be arranged in a manner to stand side by side horizontally, in a manner to stand side by side vertically, or in a manner like a Chinese character "品". When a red (R) sub-pixel, a green (G) sub-pixel, a blue (B) sub-pixel, and a white sub-pixel are included in the display panel, the four sub-pixels may be arranged in a manner to stand side by side horizontally, in a manner to stand side by side vertically, or in an array, which is not limited in the present disclosure.

Figure 3:
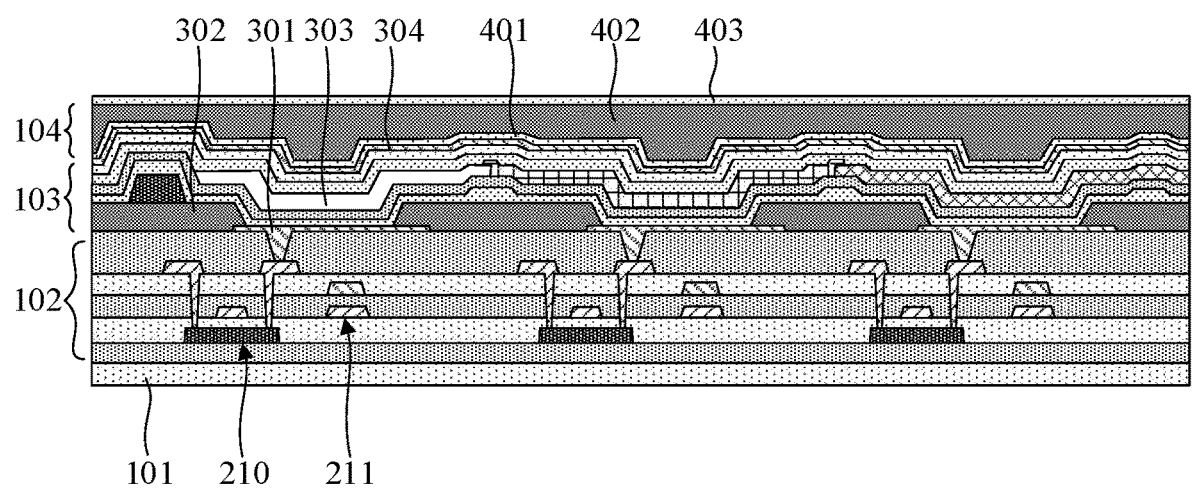
FIG. 3 is a schematic diagram of a sectional structure of a display substrate.

FIG. 3 is a schematic diagram of a sectional structure of a display substrate, and illustrates a structure of three sub-pixels of the display substrate. On a plane perpendicular to the display substrate, the display substrate may include a drive circuit layer 102 disposed on a base substrate 101, a light emitting device 103 disposed on one side of the drive circuit layer 102 away from the base substrate 101, and an encapsulation layer 104 disposed on one side of the light emitting device 103 away from the base substrate 101. In some possible implementation modes, the display substrate may include another film layer, such as a post spacer, which is not limited in the present disclosure.

In an exemplary implementation mode, the base substrate 101 may be a flexible base substrate, or a rigid base substrate. A drive circuit layer 102 of each sub-pixel may include multiple transistors and a storage capacitor that constitute a pixel drive circuit, and only one transistor 101 and one storage capacitor 101A are shown for each sub-pixel in FIG. 3 as an example. A light emitting device 103 may include an anode 301, a pixel definition layer 302, an organic emitting layer 303, and a cathode 304. The anode 301 is connected with a drain electrode of a drive transistor 210 through a via, the organic emitting layer 303 is connected with the anode 301, and the cathode 304 is connected with the organic emitting layer 303, The organic emitting layer 303 emits light of a corresponding color under drive of the anode 301 and the cathode 304. An encapsulation layer 104 may include a first encapsulation layer 401, a second encapsulation layer 402, and a third encapsulation layer 403 which are stacked; the first encapsulation layer 401 and the third encapsulation layer 403 may be made of an inorganic material, and the second encapsulation layer 402 may be made of an organic material; the second encapsulation layer 402 is disposed between the first encapsulation layer 401 and the third encapsulation layer 403 to ensure that external water vapor cannot enter into the light emitting device 103.

In an exemplary implementation mode, the organic emitting layer 303 may include a Hole Injection Layer (HIL), a Hole Transport Layer (HTL), an Electron Block Layer (EBL), an Emitting Layer (EML), a Hole Block Layer (HBL), an Electron Transport Layer (ETL), and an Electron Injection Layer (EIL) which are stacked. In an exemplary implementation mode, hole injection layers of all sub-pixels may be a common layer connected together, electron injection layers of all the sub-pixels may be a common layer connected together, hole transport layers of all the sub-pixels may be a common layer connected together, electron transport layers of all the sub-pixels may be a common layer connected together, hole block layers of all the sub-pixels may be a common layer connected together, emitting layers of adjacent sub-pixels may be overlapped slightly or may be isolated from each other, and electron block layers of adjacent sub-pixels may be overlapped slightly or may be isolated from each other.

In an exemplary embodiment, a light emitting structure may be an Organic Light Emitting Diode (OLED), including a first electrode (an anode), an organic emitting layer, and a second electrode (a cathode) which are stacked.

In an exemplary embodiment, a drive circuit may be a scan drive circuit and/or a light emitting drive circuit, which is not limited in the present disclosure.

In some exemplary embodiments, as shown in FIG. 1, the non-display region may further be provided with a timing controller 20 and a data drive circuit (not shown in the figure). Herein, a drive circuit 20 may be disposed on a left side or a right side of the display region, and the timing controller and the data drive circuit may be disposed on an upper side or a lower side of the display region. Herein, the data drive circuit may provide data signals to multiple columns of sub-pixels through multiple data lines DL. A scan drive circuit may provide scan signals to multiple rows of sub-pixels through multiple scan lines G. In addition to the scan signals, the scan drive circuit may also generate at least one control signal synchronized with a scan signal row by row, and provide it to multiple rows of sub-pixels of the display region. A light emitting drive circuit may provide light emitting control signals to multiple rows of sub-pixels through multiple light emitting control lines E.

In an exemplary embodiment, the timing controller may provide a gray-scale value and a control signal suitable for a specification of the data drive circuit to the data drive circuit, provide a clock signal, a scan start signal, etc., suitable for a specification of the scan drive circuit to the scan drive circuit, and provide a clock signal, an emission stop signal, etc., suitable for a specification of the light emitting drive circuit to the light emitting drive circuit.

In an exemplary embodiment, the data drive circuit may generate a data voltage to be provided to the data lines using the gray-scale value and the control signal received from the timing controller.

In an exemplary embodiment, the scan drive circuit may generate scan signals to be provided to the scan lines by receiving the clock signal, the scan start signal, or the like, from the timing controller. For example, the scan drive circuit may provide the scan signals to the scan lines sequentially. For example, the scan drive circuit may be composed of multiple cascaded shift registers, and may enable various shift registers to sequentially generate scan signals under control of a clock signal.

In an exemplary embodiment, the light emitting drive circuit may generate light emitting signals to be provided to the light emitting signal lines by receiving the clock signal, the emission stop signal, or the like, from the timing controller. For example, the light emitting drive circuit may sequentially provide the light emitting signals to the light emitting signal lines sequentially. For example, the light emitting drive circuit may be composed of multiple cascaded shift registers, and may enable various shift registers to sequentially generate light emitting signals under control of a clock signal.

In an exemplary embodiment, compared to a display substrate in which a first capacitor C1 and a third capacitor C3 are not overlapped with a first power supply line VGH, in the display substrate according to the present disclosure, a length of the first capacitor C1 along the first direction becomes longer and a length of the first capacitor C1 along the second direction becomes narrower, and a length of the third capacitor C3 along the first direction becomes longer, and a length of the third capacitor C3 along the second direction becomes narrower.

The display substrate according to the embodiment of the disclosure includes an underlay substrate, and a drive circuit and a first power supply line which are disposed on the underlay substrate and located in a non-display region, wherein the drive circuit at least includes a first capacitor, a second capacitor, and a third capacitor; the first capacitor and the third capacitor are arranged along a first direction, the second capacitor and the third capacitor are respectively located on both sides of the first capacitor, the second capacitor is located on one side of the first capacitor close to a display region, and one electrode plate of the third capacitor is electrically connected with the first power supply line; the first power supply line is located on one side of the second capacitor away from the display region and extends along the first direction, an orthographic projection of the first capacitor on the underlay substrate is at least partially overlapped with an orthographic projection of the first power supply line on the underlay substrate, and an ortho- graphic projection of the third capacitor on the underlay substrate is at least partially overlapped with an orthographic projection of the first power supply line on the underlay substrate. In the embodiment of the present disclosure, the orthographic projection of the first capacitor on the underlay substrate is at least partially overlapped with the orthographic projection of the first power supply line on the underlay substrate, which reduces an area occupied by the drive circuit, reduces a width of the non-display region in the display substrate, and achieves a narrow bezel of a display product.

As shown in FIG. 2, in an exemplary embodiment, an orthographic projection of the third capacitor C3 on the underlay substrate is at least partially overlapped with an orthographic projection of the first power supply line VGH on the underlay substrate. The orthographic projection of the third capacitor on the underlay substrate is at least partially overlapped with the orthographic projection of the first power supply line on the underlay substrate, which reduces an area occupied by the drive circuit, reduces a width of the non-display region in the display substrate, and achieves a narrow bezel of a display product.

As shown in FIG. 2, in an exemplary embodiment, the display substrate may further include a second power supply line VGL, an initial signal line ESTV, a first clock signal line ECK, and a second clock signal line ECB which are disposed on the underlay substrate and located in the non-display region.

In an exemplary embodiment, the second power supply line VGL is located on one side of the drive circuit 10 close to the display region and extends along the first direction. The initial signal line ESTV is located on one side of the first power supply line VGH away from the display region and extends along the first direction. The first clock signal line ECK is located between the first power supply line VGH and the initial signal line ESTV and extends along the first direction. The second clock signal line ECB is located between the first clock signal line ECK and the initial signal line ESTV and extends along the first direction.

In an exemplary embodiment, the second power supply line VGL may continuously provide a direct current signal with a low level. The initial signal line ESTV may provide a pulse signal. The first clock signal line ECK may provide a periodic pulse signal, and the second clock signal line ECB may provide a periodic pulse signal. The first clock signal line ECK and the second clock signal line ECB are not simultaneously effective level signals.

In an exemplary embodiment, a width of the second power supply line VGL may be less than or equal to a width of the first power supply line VGH, and/or, a width of the initial signal line ESTV may be smaller than a width of the first power supply line VGH, and/or, a width of the first clock signal line ECK may be smaller than a width of the first power supply line VGH and may be greater than a width of the initial signal line ESTV, and/or, a width of the second clock signal line ECB may be smaller than a width of the first power supply line VGH and may be greater than a width of the initial signal line ESTV.

In this embodiment, the width of the second power supply line VGL is smaller than or equal to the width of the first power supply line VGH, which may reduce a width of the non-display region of the display substrate and achieve a narrow bezel.

In an exemplary embodiment, the width of the second power supply line VGL may be about 6 microns to 12 microns.

In this embodiment, the width of the initial signal line ESTV is smaller than the width of the first power supply line VGH, which may reduce a width of the non-display region of the display substrate and achieve a narrow bezel.

In an exemplary embodiment, the width of the initial signal line ESTV may be about 5 microns to 10 microns.

In this embodiment, the width of the first clock signal line ECK is smaller than the width of the first power supply line VGH, which may reduce a width of the non-display region of the display substrate and achieve a narrow bezel.

In an exemplary embodiment, the width of the first clock signal line ECK may be about 6 microns to 20 microns.

In this embodiment, the width of the second clock signal line ECB is smaller than the width of the first power supply line VGH, which may reduce a width of the non-display region of the display substrate and achieve a narrow bezel.

In an exemplary embodiment, the width of the second clock signal line ECB may be about 6 microns to 20 microns.

Figure 4:
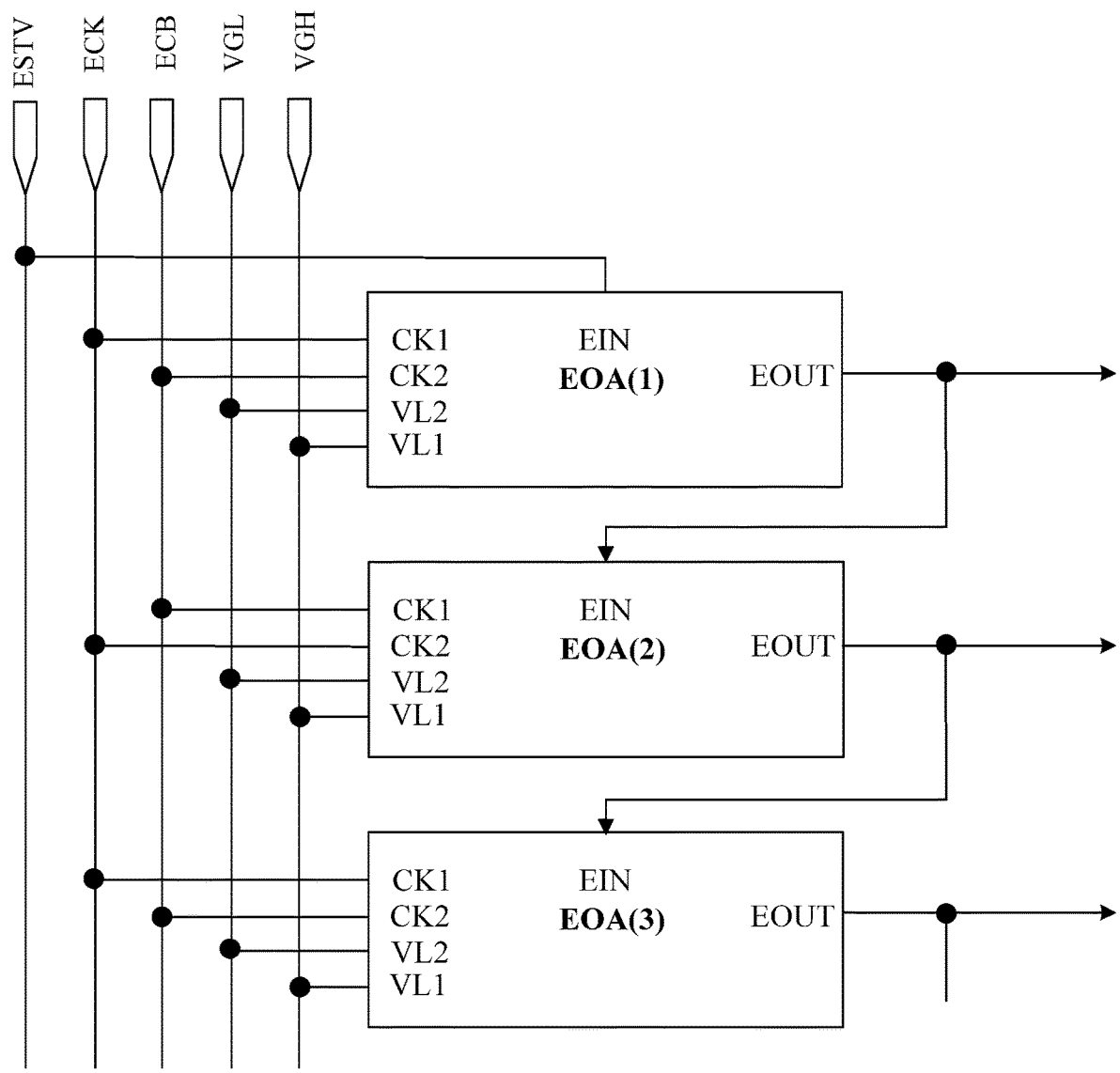
FIG. 4 is a schematic diagram of a structure of a drive circuit according to an exemplary embodiment.
Figure 5:
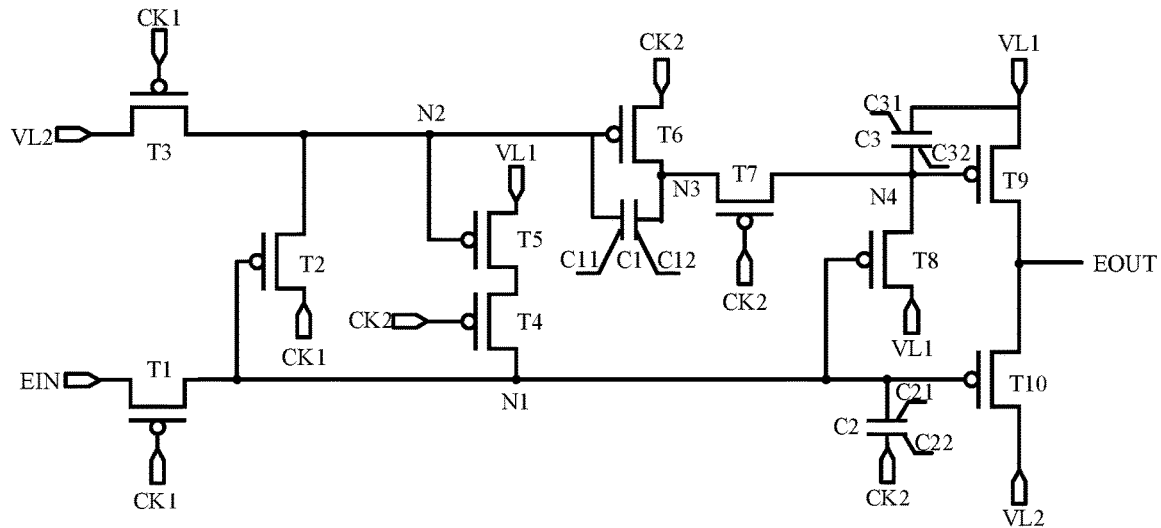
FIG. 5 is an equivalent circuit diagram of a shift register according to an exemplary embodiment.

FIG. 4 is a schematic diagram of a structure of a drive circuit according to an exemplary embodiment, and FIG. 5 is an equivalent circuit diagram of a shift register according to an exemplary embodiment. FIG. 4 is illustrated by taking the drive circuit being a light emitting drive circuit as an example. As shown in FIGS. 4 and 5, the drive circuit includes multiple shift registers EOA (1) to EOA (k) arranged along a first direction, wherein k=m/2. Each shift register EOA includes: a first transistor T1 to a tenth transistor T10, a first capacitor C1 to a third capacitor C3, a signal input terminal EIN, a signal output terminal EOUT, a first clock signal terminal CK1, a second clock signal terminal CK2, a first power supply terminal VL1, and a second power supply terminal VL2.

A gate electrode of the first transistor T1 is electrically connected with the first clock signal terminal CK1, a source electrode of the first transistor T1 is electrically connected with the signal input terminal EIN, and a drain electrode of the first transistor T1 is electrically connected with a first node N1. A gate electrode of the second transistor T2 is electrically connected with the first node N1, a source electrode of the second transistor T2 is electrically connected with the first clock signal terminal CK1, and a second electrode of the second transistor T2 is electrically connected with a second node N2. A gate electrode of the third transistor T3 is electrically connected with the first clock signal terminal CK1, a source electrode of the third transistor T3 is electrically connected with the second power supply terminal VL2, and a second electrode of the third transistor T3 is electrically connected with the second node N2. A gate electrode of the fourth transistor T4 is electrically connected with the second clock signal terminal CK2, a source electrode of the fourth transistor T4 is electrically connected with the first node N1, and a drain electrode of the fourth transistor T4 is electrically connected with a source electrode of the fifth transistor. A gate electrode of the fifth transistor T5 is electrically connected with the second node N2, and a drain electrode of the fifth transistor T5 is electrically connected with the first power supply terminal VL1. A gate electrode of the sixth transistor T6 is electrically connected with the second node N2, a source electrode of the sixth transistor T6 is electrically connected with the second clock signal terminal CK2, and a drain electrode of the sixth transistor T6 is electrically connected with a third node N3. A gate electrode of the seventh transistor T7 is electrically connected with the second clock signal terminal CK2, a source electrode of the seventh transistor T7 is electrically connected with the third node N3, and a drain electrode of the seventh transistor T7 is electrically connected with a fourth node N4. A gate electrode of the eighth transistor T8 is electrically connected with the first node N1, a source electrode of the eighth transistor T8 is electrically connected with the first power supply terminal VL1, and a drain electrode of the eighth transistor T8 is electrically connected with the fourth node N4. A gate electrode of the ninth transistor T9 is electrically connected with the fourth node N4, a source electrode of the ninth transistor T9 is electrically connected with the signal output terminal EOUT, and a drain electrode of the ninth transistor T9 is electrically connected with the first power supply terminal VL1. A gate electrode of the tenth transistor T10 is electrically connected with the first node N1, a source electrode of the tenth transistor T10 is electrically connected with the second power supply terminal VL2, and a drain electrode of the tenth transistor T10 is electrically connected with the signal output terminal EOUT. A first electrode plate C11 of the first capacitor C1 is electrically connected with the second node N2, and a second electrode plate C12 of the first capacitor C1 is electrically connected with the third node N3. A first electrode plate C21 of the second capacitor C2 is electrically connected with the first node N1, and a second electrode plate C22 of the second capacitor C2 is electrically connected with the second clock signal terminal CK2. A first electrode plate C31 of the third capacitor C3 is electrically connected with the fourth node N4, and a second electrode plate C32 of the third capacitor C3 is electrically connected with the first power supply terminal VL1.

In an exemplary embodiment, the first clock signal terminal CK1 and the second clock signal terminal CK2 are continuously switched between high and low levels, respectively.

In an exemplary embodiment, the first power supply terminal VL1 continuously outputs a high level signal, and the second power supply terminal VL2 continuously outputs a low level signal.

In an exemplary embodiment, the first capacitor C1 is configured to maintain a potential of the second node N2. The second capacitor C2 is configured to maintain a potential of the first node N1. The third capacitor C3 is configured to maintain a potential of the fourth node N4.

In an exemplary embodiment, a low temperature poly silicon thin film transistor may be adopted, or an oxide thin film transistor may be adopted, or a low temperature poly silicon thin film transistor and an oxide thin film transistor may be adopted for the first transistor T1 to the tenth transistor T10. Low Temperature Poly Silicon (LTPS for short) may be adopted for an active layer of a low temperature poly silicon thin film transistor, and an oxide may be adopted for an active layer of an oxide thin film transistor. The low temperature poly silicon thin film transistor has advantages of a high mobility, fast charging, and the like, and the oxide thin film transistor has advantages of a low leakage current and the like. In an exemplary implementation mode, a low temperature poly silicon thin film transistor and an oxide thin film transistor may be integrated on one display substrate to form a Low Temperature Polycrystalline Oxide (LTPO for short) display substrate, so that advantages of the two may be utilized, high Pixel Per Inch (PPI for short) and low-frequency drive may be achieved, power consumption may be reduced, and display quality may be improved.

In an exemplary embodiment, the first transistor T1 to the tenth transistor T10 may be P-type transistors, or may be N-type transistors. Use of a same type of transistors in a pixel drive circuit may simplify a process flow, reduce process difficulties of a display panel, and improve a product yield. In an exemplary embodiment, the first transistor T1 to the tenth transistor T10 may include a P-type transistor and an N-type transistor.

When a low level is applied to a gate electrode of a P-type transistor, the P-type transistor is turned on, and when a high level is applied to the gate electrode of the P-type transistor, the P-type transistor is turned off. Accordingly, a clock signal is a signal that is periodically switched between two different levels, and the two levels are usually used for turning on a transistor and turn off the transistor respectively, so a higher one of the two is usually referred to as a high level and a lower one of the two is referred to as a low level.

In an exemplary embodiment, the first transistor T1 may be a P-type transistor, when a signal of the first clock signal terminal CK1 is at a low level, the first transistor T1 is in a turned-on state, and when the signal of the first clock signal terminal CK1 is at a high level, the first transistor T1 is in a turned-off state. The second transistor T2 may be a P-type transistor, when a signal of the first node N1 is at a low level, the second transistor T2 is in a turned-on state, and when the signal of the first node N1 is at a high level, the second transistor T2 is in a turned-off state. The third transistor T3 may be a P-type transistor, when a signal of the first clock signal terminal CK1 is at a low level, the third transistor T3 is in a turned-on state, and when the signal of the first clock signal terminal CK1 is at a high level, the third transistor T3 is in a turned-off state. The fourth transistor T4 may be a P-type transistor, when a signal of the second clock signal terminal CK2 is at a low level, the fourth transistor T4 is in a turned-on state, and when the signal of the second clock signal terminal CK2 is at a high level, the fourth transistor T4 is in a turned-off state. The fifth transistor T5 may be a P-type transistor, when a signal of the second node N2 is at a low level, the fifth transistor T5 is in a turned-on state, and when the signal of the second node N2 is at a high level, the fifth transistor T5 is in a turned-off state. The sixth transistor T6 may be a P-type transistor, when the signal of the second node N2 is at a low level, the sixth transistor T6 is in a turned-on state, and when the signal of the second node N2 is at a high level, the sixth transistor T6 is in a turned-off state. The seventh transistor T7 may be a P-type transistor, when the signal of the second clock signal terminal CK2 is at a low level, the seventh transistor T7 is in a turned-on state, and when the signal of the second clock signal terminal CK2 is at a high level, the seventh transistor T7 is in a turned-off state. The eighth transistor T8 may be a P-type transistor, when the signal of the first node N1 is at a low level, the eighth transistor T8 is in a turned-on state, and when the signal of the first node N1 is at a high level, the eighth transistor T8 is in a turned-off state. The ninth transistor T9 may be a P-type transistor, when a signal of the fourth node N4 is at a low level, the ninth transistor T9 is in a turned-on state, and when the signal of the fourth node N4 is at a high level, the ninth transistor T9 is in a turned-off state. The tenth transistor T10 may be a P-type transistor, when the signal of the first node N1 is at a low level, the tenth transistor T10 is in a turned-on state, and when the signal of the first node N1 is at a high level, the tenth transistor T10 is in a turned-off state.

In an exemplary embodiment, the first electrode plate C11 of the first capacitor C1 is located on one side of the second electrode plate C12 of the first capacitor C1 close to the underlay substrate, and an orthographic projection of the first electrode plate C11 of the first capacitor C1 on the underlay substrate covers an orthographic projection of the second electrode plate C12 of the first capacitor C1 on the underlay substrate.

In an exemplary embodiment, an area of the first capacitor C1 may be about 200 square microns to 300 square microns.

In an exemplary embodiment, the first electrode plate C21 of the second capacitor C2 is located on one side of the second electrode plate C22 of the second capacitor C2 close to the underlay substrate, and an orthographic projection of the first electrode plate C21 of the second capacitor C2 on the underlay substrate covers an orthographic projection of the second electrode plate C22 of the second capacitor C2 on the underlay substrate.

In an exemplary embodiment, an area of the second capacitor C2 may be about 300 square microns to 500 square microns.

In an exemplary embodiment, the first electrode plate C31 of the third capacitor C3 is located on one side of the second electrode plate C32 of the third capacitor C3 close to the underlay substrate, and an orthographic projection of the first electrode plate C31 of the third capacitor C3 on the underlay substrate covers an orthographic projection of the second electrode plate C32 of the third capacitor C3 on the underlay substrate.

In an exemplary embodiment, an area of the third capacitor C3 may be about 300 square microns to 500 square microns.

In an exemplary embodiment, as shown in FIG. 2, an area of an overlapping portion of an orthographic projection of a first electrode plate of the first capacitor C1 on the underlay substrate and an orthographic projection of the first power supply line VGH on the underlay substrate is positively related to an area of the first electrode plate of the first capacitor, that is, the larger the area of the first capacitor is, the larger an area of an overlapping region of an orthographic projection of the first capacitor C1 on the underlay substrate and the orthographic projection of the first power supply line VGH on the underlay substrate is.

In an exemplary embodiment, as shown in FIG. 2, an area of an overlapping portion of an orthographic projection of a first electrode plate of the third capacitor C3 on the underlay substrate and an orthographic projection of the first power supply line VGH on the underlay substrate is positively related to an area of a first electrode plate of the first capacitor, that is, the larger the area of the first capacitor is, the larger an area of an overlapping region of an orthographic projection of the third capacitor C3 on the underlay substrate and the orthographic projection of the first power supply line VGH on the underlay substrate is.

In an exemplary embodiment, a width of an overlapping portion of the first electrode plate of the third capacitor C3 and the first power supply line VGH may be equal to a width of the first power supply line VGH.

In an exemplary embodiment, an area of an overlapping portion of the first electrode plate of the first capacitor and the first power supply line may be smaller than an area of an overlapping portion of the first electrode plate of the third capacitor and the first power supply line.

A shift register according to an exemplary embodiment is illustrated below through a working process of a shift register.

Figure 6:
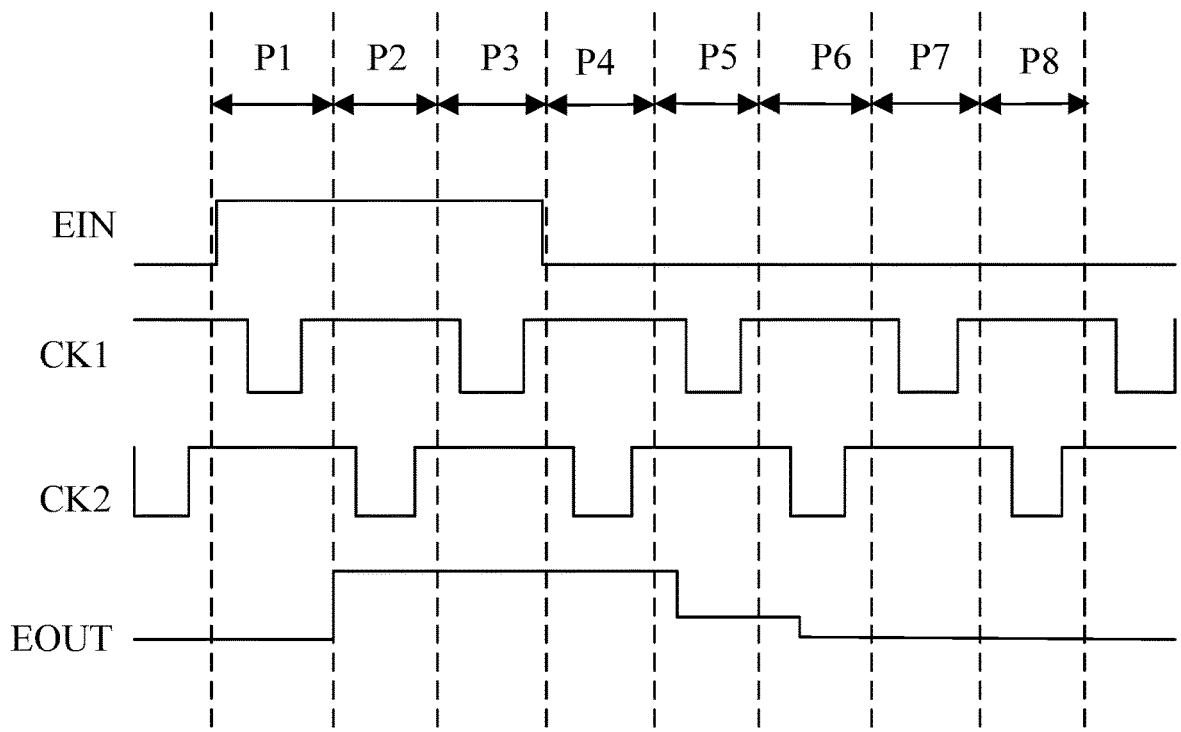
FIG. 6 is a working timing diagram of a shift register according to an exemplary embodiment.

Taking transistors T1 to T10 in a shift register according to an exemplary embodiment all being P-type transistors as an example, FIG. 6 is a working timing diagram of a shift register according to an exemplary embodiment. As shown in FIGS. 5 and 6, a shift register involved in an exemplary embodiment includes: ten switching transistors (T1 to T10), three capacitor units (C1 to C3), three signal input terminals (CK1, CK2, and EIN), one signal output terminal (EOUT), and two power supply terminals (V1 and V2).

A working process of a shift register according to an exemplary embodiment may include: a first phase P1 to an eighth phase P8.

In the first phase P1, a signal of the signal input terminal EIN is a high level signal, a signal of the first clock signal terminal CK1 is a low level signal, the first transistor T1 and the third transistor T3 are turned on, and the signal of the signal input terminal EIN is written into a first node N1, at this time, the first node N1 is at a high level, and a signal of the second power supply terminal VL2 is written into a second node N2, at this time, the second node N2 is at a low level. Since the first node N1 is at a high level, the second transistor T2, the eighth transistor T8, and the tenth transistor T10 are turned off. A signal of the second clock signal terminal CK2 is a high level signal, and the fourth transistor T4 and the seventh transistor T7 are turned off. Since the second node N2 is at a low level, the fifth transistor T5 and the sixth transistor T6 are turned on, and the signal of the second clock signal terminal CK2 is written into a third node N3. Since a voltage across a capacitor will not change abruptly, a fourth node N4 remains at a high level of a previous frame, the ninth transistor T9 is turned off, and an output signal of the signal output terminal EOUT remains at a low level of a previous frame.

In the second phase P2, a signal of the signal input terminal EIN and a signal of the first clock signal terminal CK1 are high level signals, the first transistor T1 and the third transistor T3 are turned off, the first node N1 remains at a high level, the second transistor T2, the eighth transistor T8, and the tenth transistor T10 are turned off, the second node N2 remains at a low level, the fifth transistor T5 and the sixth transistor T6 are turned on, since a signal of the second clock signal terminal CK2 is a low level signal, the fourth transistor T4 and the seventh transistor T7 are turned on, the signal of the second clock signal terminal CK2 is written into the third node N3, the third node N3 changes from being at a high level to being at a low level, a signal of the third node N3 is written into the fourth node N4, the fourth node N4 is at a low level, the ninth transistor T9 is turned on, and the signal output terminal EOUT outputs a high level signal of the first power supply terminal VL1.

In the third phase P3, a signal of the signal input terminal EIN is a high level signal, a signal of the first clock signal terminal CK1 is a low level signal, the first transistor T1 and the third transistor T3 are turned on, the first node N1 is at a high level, the second transistor T2, the eighth transistor T8, and the tenth transistor T10 are turned off, the second node N2 remains at a low level, the fifth transistor T5 and the sixth transistor T6 are turned on, a signal of the second clock signal terminal CK2 is written into the third node N3, since the signal of the second clock signal terminal CK2 is a high level signal, the third node N3 changes from being at a low level of a previous phase to being at a high level, the fourth transistor T4 and the seventh transistor T7 are turned off, the fourth node N4 remains at a low level, the ninth transistor T9 is turned on, and the signal output terminal EOUT outputs a high level signal of the first power supply terminal VL1.

In the fourth phase P4, a signal of the signal input terminal EIN is a low level signal, a signal of the first clock signal terminal CK1 is a high level signal, the first transistor T1 and the third transistor T3 are turned off, the first node N1 remains at a high level, the second transistor T2, the eighth transistor T8, and the tenth transistor T10 are turned off, the second node N2 remains at a low level, the fifth transistor T5 and the sixth transistor T6 are turned on, a signal of the second clock signal terminal CK2 is written into the third node N3, since the signal of the second clock signal terminal CK2 is a low level signal, the third node N3 changes from being at a high level of a previous phase to being at a low level, the fourth transistor T4 and the seventh transistor T7 are turned on, a signal of the third node N3 is written into the fourth node N4, the fourth node N4 remains at a low level, the ninth transistor T9 is turned on, and the signal output terminal EOUT outputs a high level signal of the first power supply terminal VL1.

In the fifth phase P5, a signal of the signal input terminal EIN and a signal of the first clock signal terminal CK1 are low level signals, the first transistor T1 and the third transistor T3 are turned on, the first node N1 changes from being at a high level to being at a low level, the second transistor T2, the eighth transistor T8, and the tenth transistor T10 are turned on, the second node N2 remains at a low level, the fifth transistor T5 and the sixth transistor T6 are turned on, a signal of the second clock signal terminal CK2 is written into the third node N3, since the signal of the second clock signal terminal CK2 is a high level signal, the third node N3 changes from being at a low level of a previous phase to being at a high level, the fourth transistor T4 and the seventh transistor N4 are turned off, since the eight transistor T8 is turned on, a high level signal of the first power supply terminal VL1 is written into the fourth node N4, the fourth node N4 changes to be at a high level, the ninth transistor T9 is turned off, since the tenth transistor T10 is turned on, a low level signal of the second power supply terminal VL2 is written into the signal output terminal EOUT, and the signal output terminal EOUT outputs a low level signal.

In the sixth phase P6, a signal of the signal input terminal EIN is a low level signal, a signal of the first clock signal terminal CK1 is a high level signal, the first transistor T1 and the third transistor T3 are turned off, the first node EN1 remains at a low level, the second transistor T2, the eighth transistor T8, and the tenth transistor T10 are turned on, the signal of the first clock signal terminal CK1 is written into the second node N2, the second node N2 changes from being at a low level to being at a high level, the fifth transistor T5 and the sixth transistor T6 are turned off, the third node N3 remains at a high level, since a signal of the second clock signal terminal CK2 is a low level signal, the fourth transistor T4 and the seventh transistor T7 are turned on, a signal of the third node N3 is written into the fourth node N4, the fourth node N4 remains at a high level, the ninth transistor T9 is turned off, since the tenth transistor T10 is turned on, a low level signal of the second power supply terminal VL2 is written into the signal output terminal EOUT, and the signal output terminal EOUT outputs a low level signal.

In the seventh phase P7, a signal of the signal input terminal EIN is a low level signal, a signal of the first clock signal terminal CK1 is a low level signal, the first transistor T1 and the third transistor T3 are turned on, the first node EN1 remains at a low level, the second transistor T2, the eighth transistor T8, and the tenth transistor T10 are turned on, the signal of the first clock signal terminal CK1 is written into the second node N2, the second node N2 is at a low level, the fifth transistor T5 and the sixth transistor T6 are turned on, a signal of the second clock signal terminal CK2 is written into the third node N3, since the signal of the second clock signal terminal CK2 is a high level signal, the fourth transistor T4 and the seventh transistor T7 are turned off, the fourth node N4 remains at a high level, the ninth transistor T9 is turned off, since the tenth transistor T10 is turned on, a low level signal of the second power supply terminal VL2 is written into the signal output terminal EOUT, and the signal output terminal EOUT outputs a low level signal.

In the eighth phase P8, a signal of the signal input terminal EIN is a low level signal, a signal of the first clock signal terminal CK1 is a high level signal, the first transistor T1 and the third transistor T3 are turned off, the first node EN1 remains at a low level, the second transistor T2, the eighth transistor T8, and the tenth transistor T10 are turned on, the signal of the first clock signal terminal CK1 is written into the second node N2, the second node N2 changes from being at a low level to being at a high level, the fifth transistor T5 and the sixth transistor T6 are turned off, the third node N3 remains at a high level, since a signal of the second clock signal terminal CK2 is a low level signal, the fourth transistor T4 and the seventh transistor T7 are turned on, a signal of the third node N3 is written into the fourth node N4, the fourth node N4 remains at a high level, the ninth transistor T9 is turned off, since the tenth transistor T10 is turned on, a low level signal of the second power supply terminal VL2 is written into the signal output terminal EOUT, and the signal output terminal EOUT outputs a low level signal.

After the first phase P1, the seventh phase P7 and the eighth phase P8 are circulated and repeated, the eighth transistor T8 is continuously turned on, the ninth transistor T9 is turned off, the first transistor T1 periodically charges the second capacitor C2, the first node N1 remains at a low level, the tenth transistor T10 is continuously turned on, and the signal output terminal EOUT outputs a low level signal, until a pulse of the signal input terminal EIN of a next frame enters.

Figure 7:
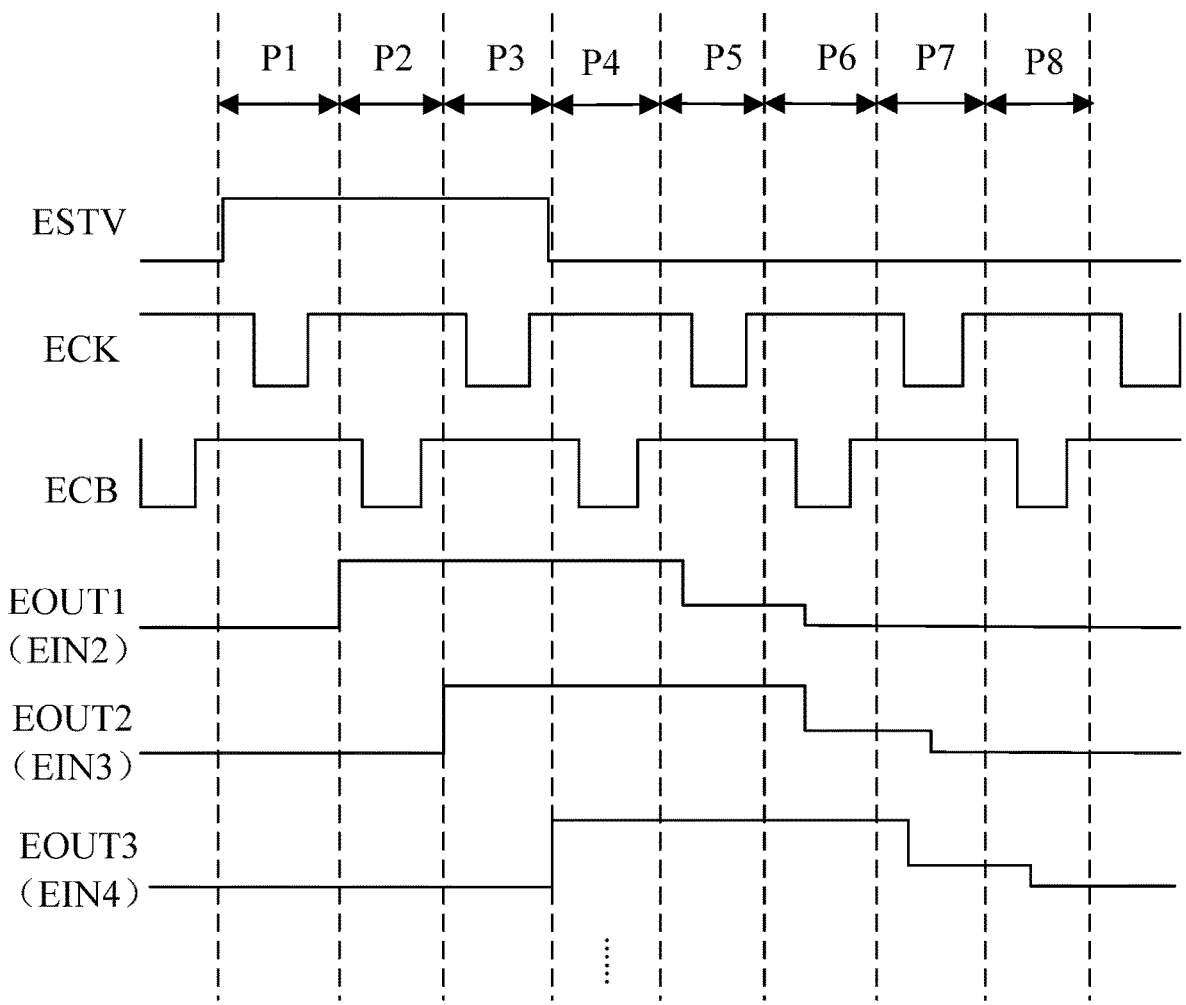
FIG. 7 is a timing diagram of a drive circuit according to an exemplary embodiment.

In an exemplary embodiment, FIG. 7 is a timing diagram of a drive circuit according to an exemplary embodiment. In FIG. 7, EOUTi is a signal output terminal of an ith-stage shift register EOA (i), and EINi is a signal input terminal of the ith-stage shift register EOA (i). As shown in FIG. 4 and FIG. 7, a signal input terminal of a first-stage shift register EOA (1) is electrically connected with an initial signal line ESTV, a signal output terminal of an (i−1)th-stage shift register is electrically connected with the signal input terminal of the ith-stage shift register, first power supply terminals VL1 of all shift registers are electrically connected with a first power supply line VGH, second power supply terminals VL2 of all the shift registers are electrically connected with a second power supply line VGL, a first clock signal terminal CK1 of an odd-stage shift register is electrically connected with a first clock signal line ECK, a second clock signal terminal CK2 of the odd-stage shift register is electrically connected with a second clock signal line ECB, a first clock signal terminal CK1 of an even-stage shift register is electrically connected with the second clock signal line ECB, a second clock signal terminal CK2 of the even-stage shift register is electrically connected with the first clock signal line ECK, wherein i is a positive integer greater than or equal to 2.

In an exemplary embodiment, a signal output terminal of the ith-stage shift register is electrically connected with sub-pixels in a (2i−1)th row and sub-pixels in a (2i)th row. Herein, the signal output terminal of the ith-stage shift register is electrically connected with the sub-pixels in the (2i−1)th row through a light emitting signal line in the (2i−1)th row, and electrically connected with the sub-pixels in the (2i)th row through a light emitting signal line in the (2i)th row.

In an exemplary embodiment, as shown in FIG. 2, each shift register includes: a connection electrode 40. An orthographic projection of the connection electrode 40 on the underlay substrate is at least partially overlapped with an orthographic projection of the signal output terminal EOUT on the underlay substrate. Herein, a connection electrode is electrically connected with a signal output terminal of a shift register of a present stage and a signal input terminal of a shift register of a next stage, respectively.

In an exemplary embodiment, as shown in FIG. 2, the first transistor T1, the second transistor T2, the third transistor T3, the fourth transistor T4, and the fifth transistor T5 are located on one side of the first capacitor C1 away from the third capacitor C3, and located on one side of the second capacitor C2 close to the first power supply line VGH.

In an exemplary embodiment, as shown in FIG. 2, the sixth transistor T6 is located on one side of the first capacitor C1 close to the second power supply line VGL, and located on one side of the second capacitor C2 close to the third capacitor C3. The sixth transistor T6 is located on one side of the first capacitor C1 close to the second power supply line VGL, and located on one side of the second capacitor C2 close to the third capacitor C3, which may reduce space occupied by the sixth transistor in the first direction, and may achieve a narrow bezel of a display product.

In an exemplary embodiment, as shown in FIG. 2, the seventh transistor T7 and the eighth transistor T8 are located between the first capacitor C1 and the third capacitor C3.

In an exemplary embodiment, as shown in FIG. 2, the ninth transistor T9 and the tenth transistor T10 are located on one side of the second capacitor C2 close to the second power supply line VGL.

Figure 8:
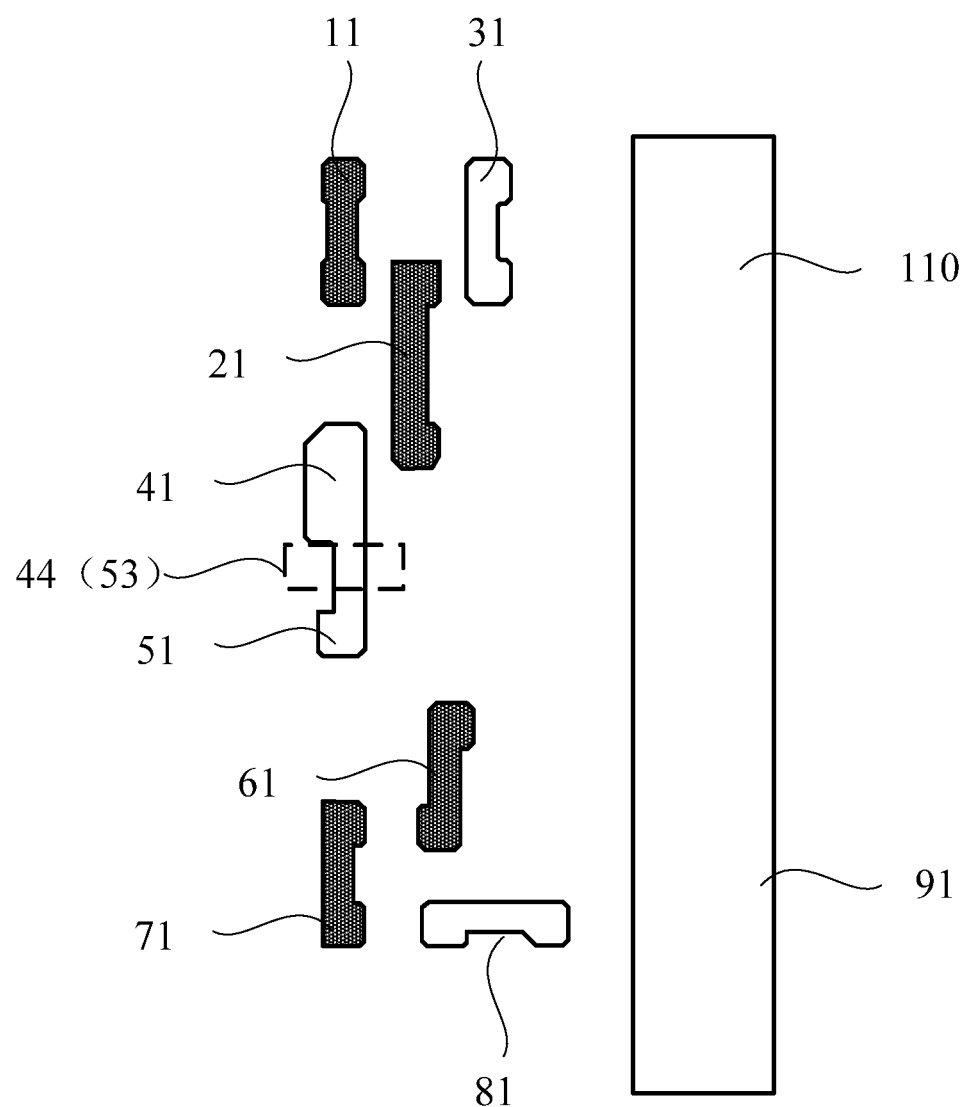
FIG. 8 is a schematic diagram of a structure of a semiconductor layer according to an exemplary embodiment.
Figure 9:
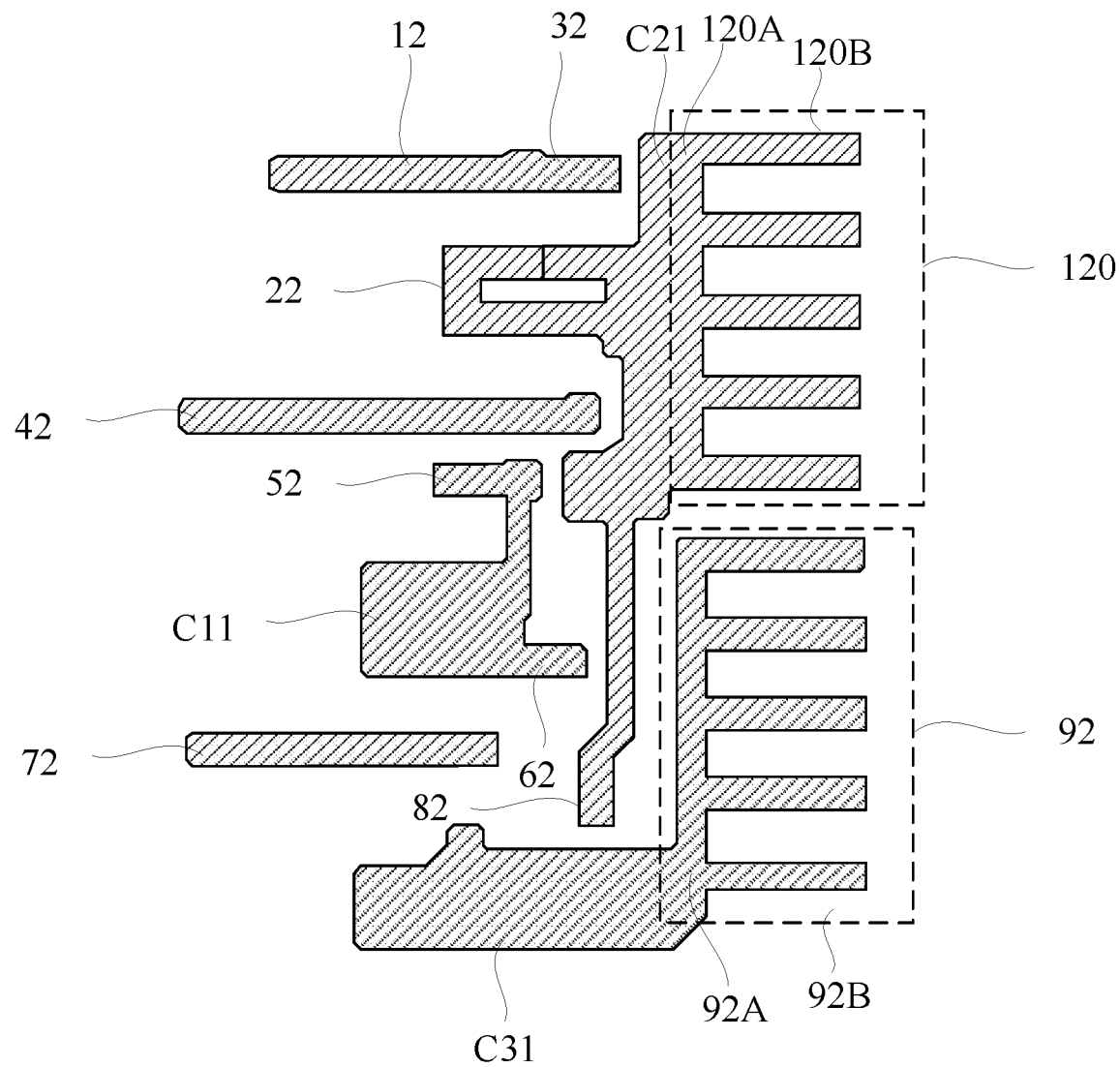
FIG. 9 is a schematic diagram of a structure of a first metal layer according to an exemplary embodiment.
Figure 10:
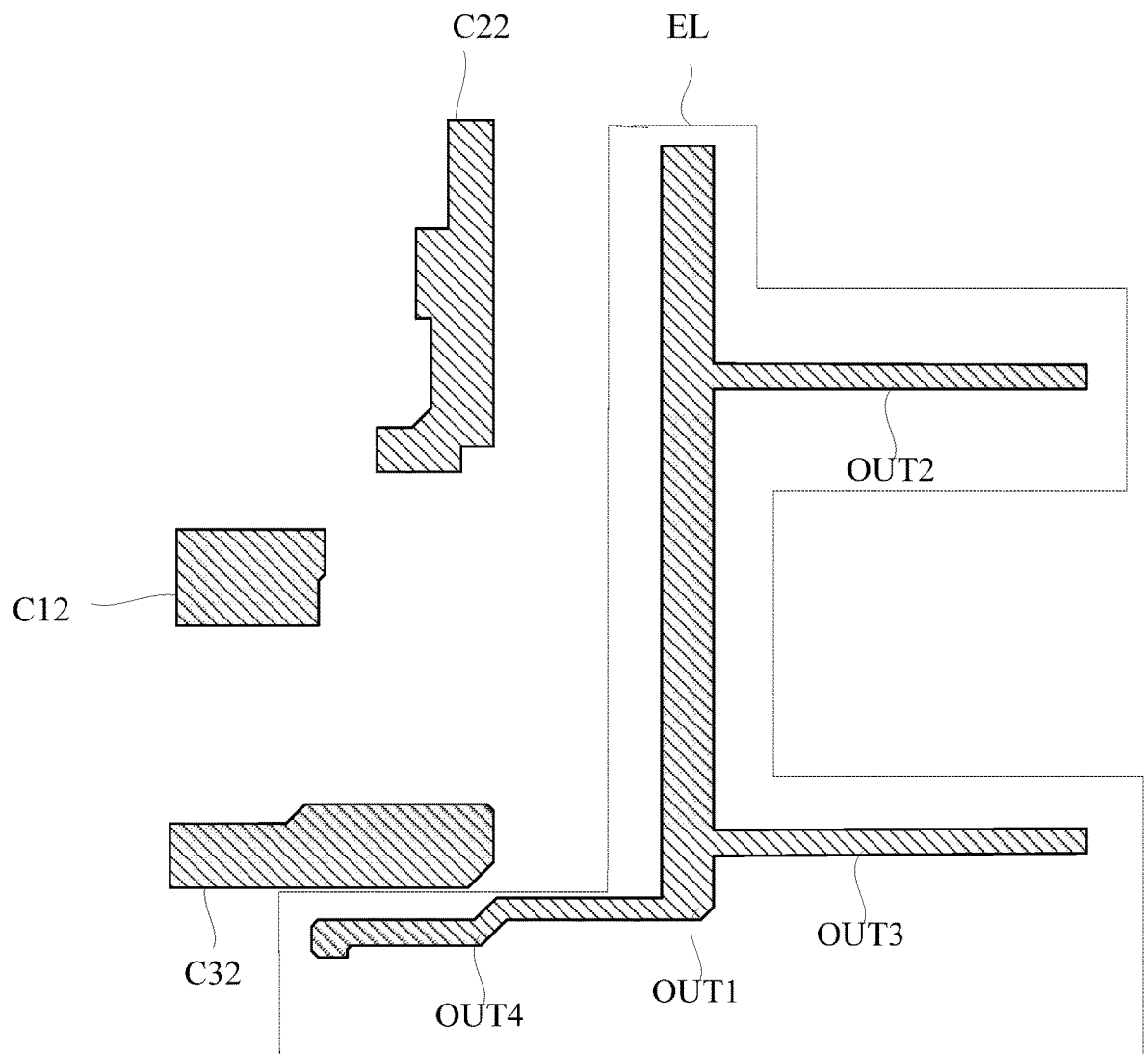
FIG. 10 is a schematic diagram of a structure of a second metal layer according to an exemplary embodiment.
Figure 11:
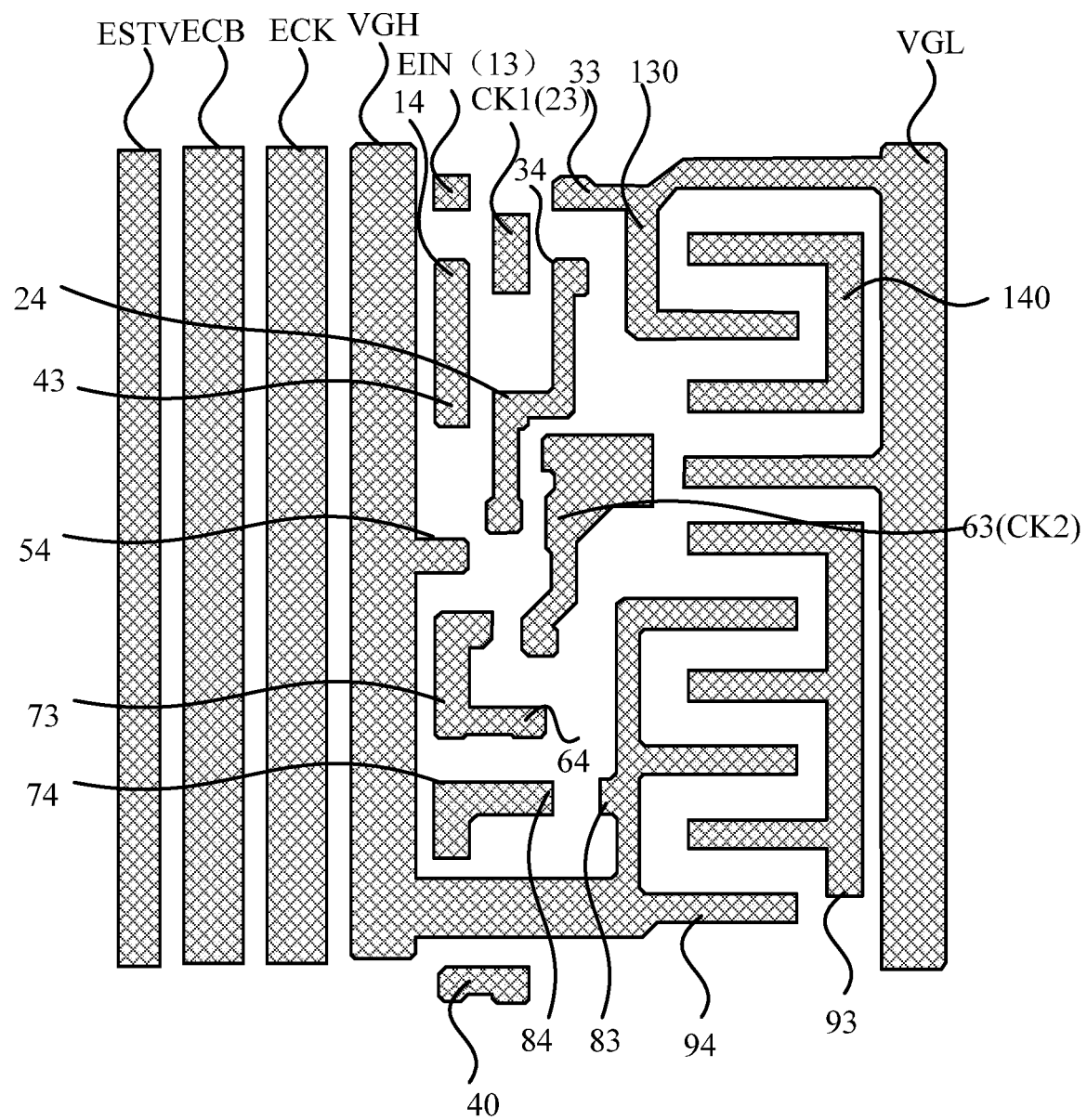
FIG. 11 is a schematic diagram of a structure of a third metal layer according to an exemplary embodiment.

FIG. 8 is a schematic diagram of a structure of a semiconductor layer according to an exemplary embodiment, FIG. 9 is a schematic diagram of a structure of a first metal layer according to an exemplary embodiment, FIG. 10 is a schematic diagram of a structure of a second metal layer according to an exemplary embodiment, and FIG. 11 is a schematic diagram of a structure of a third metal layer according to an exemplary embodiment. As shown in FIGS. 8 to 11, a display substrate according to an exemplary embodiment includes: a semiconductor layer, a first insulation layer, a first metal layer, a second insulation layer, a second metal layer, a third insulation layer, and a third metal layer which are sequentially stacked on the underlay substrate.

In an exemplary embodiment, as shown in FIG. 8, the semiconductor layer includes: active layers of multiple transistors. Herein, the active layers of the multiple transistors include: an active layer 11 of a first transistor T1, an active layer 21 of a second transistor T2, an active layer 31 of a third transistor T3, an active layer 41 of a fourth transistor T4, an active layer 51 of a fifth transistor T5, an active layer 61 of a sixth transistor T6, an active layer 71 of a seventh transistor T7, an active layer 81 of an eighth transistor T8, an active layer 91 of a ninth transistor T9, and an active layer 110 of a tenth transistor T10.

In an exemplary embodiment, as shown in FIG. 8, the active layer 11 of the first transistor T1, the active layer 21 of the second transistor T2, the active layer 31 of the third transistor T3, the active layer 41 of the fourth transistor T4, the active layer 51 of the fifth transistor T5, the active layer 61 of the sixth transistor T6, the active layer 71 of the seventh transistor T7, the active layer 91 of the ninth transistor T9, and the active layer 110 of the tenth transistor T10 all extend along a first direction. The active layer 81 of the eighth transistor T8 extends along a second direction. Herein, the first direction intersects with the second direction.

In an exemplary embodiment, as shown in FIG. 8, in each shift register, the active layers of all the transistors include: a channel region, and a source connection portion and a drain connection portion located on both sides of the channel region, wherein a source electrode of a transistor is electrically connected with the source connection portion, and a drain electrode of the transistor is electrically connected with the drain connection portion. Herein, a drain connection portion of the active layer of the fourth transistor is multiplexed as a drain electrode, a source connection portion of the active layer of the fifth transistor is multiplexed as a source electrode, and the drain connection portion of the active layer of the fourth transistor is electrically connected with the source connection portion of the active layer of the fifth transistor.

In some exemplary embodiments, the channel region may not be doped with impurities and have characteristics of a semiconductor. The source connection portion and the drain connection portion may be on both sides of the channel region, and doped with impurities, and thus have conductivity. An impurity may be changed according to a type (e.g., an N type or a P type) of a transistor.

In an exemplary embodiment, as shown in FIG. 9, the first metal layer includes gate electrodes of multiple transistors, a first electrode plate C11 of a first capacitor C1, a first electrode plate C21 of a second capacitor C2, and a first electrode plate C31 of a third capacitor C3. The gate electrodes of the multiple transistors include: a gate electrode 12 of the first transistor T1, a gate electrode 22 of the second transistor T2, a gate electrode 32 of the third transistor T3, a gate electrode 42 of the fourth transistor T4, a gate electrode 52 of the fifth transistor T5, a gate electrode 62 of the sixth transistor T6, a gate electrode 72 of the seventh transistor T7, a gate electrode 82 of the eighth transistor T8, a gate electrode 92 of the ninth transistor T9, and a gate electrode 120 of the tenth transistor T10.

In an exemplary embodiment, when a first clock signal terminal in a shift register is electrically connected with a first clock signal line and a second clock signal terminal is electrically connected with a second clock signal line, an orthographic projection of the gate electrode 12 of the first transistor T1 on an underlay substrate is at least partially overlapped with an orthographic projection of the first clock signal line on the underlay substrate. An orthographic projection of the gate electrode 42 of the fourth transistor T4 on the underlay substrate is at least partially overlapped with an orthographic projection of the second clock signal line on the underlay substrate, an orthographic projection of the gate electrode 72 of the seventh transistor T7 on the underlay substrate is at least partially overlapped with the orthographic projection of the second clock signal line on the underlay substrate, or, when the first clock signal terminal in the shift register is electrically connected with the second clock signal line and the second clock signal terminal is electrically connected with the first clock signal line, the orthographic projection of the gate electrode 12 of the first transistor T1 on the underlay substrate is at least partially overlapped with the orthographic projection of the second clock signal line on the underlay substrate. The orthographic projection of the gate electrode 42 of the fourth transistor T4 on the underlay substrate is at least partially overlapped with the orthographic projection of the first clock signal line on the underlay substrate, and the orthographic projection of the gate electrode 72 of the seventh transistor T7 on the underlay substrate is at least partially overlapped with the orthographic projection of the first clock signal line on the underlay substrate. FIG. 2 is illustrated by taking the first clock signal terminal in the shift register being electrically connected with the first clock signal line and the second clock signal terminal being electrically connected with the second clock signal line as an example.

In an exemplary embodiment, in each shift register, the gate electrode 22 of the second transistor T2, the gate electrode 120 of the tenth transistor T10, the gate electrode 82 of the eighth transistor T8, and the first electrode plate C21 of the second capacitor C2 are of an integrally formed structure.

In an exemplary embodiment, in each shift register, the gate electrode 52 of the fifth transistor T5, the gate electrode 62 of the sixth transistor T6, and the first electrode plate C11 of the first capacitor C1 are of an integrally formed structure.

In an exemplary embodiment, in each shift register, the gate electrode 92 of the ninth transistor T9 and the first electrode plate C31 of the third capacitor C3 are of an integrally formed structure.

In an exemplary embodiment, as shown in FIG. 9, a shape of the first electrode plate C11 of the first capacitor may be a square.

In an exemplary embodiment, as shown in FIG. 9, a shape of the first electrode plate C21 of the second capacitor may be superposition of two squares, a first square and a second square are arranged along the first direction, a width of the second square is larger than a width of the first square, a length of the second square is smaller than a length of the first square, and a left edge of the second square is located on one side of a left edge of the first square close to the gate electrode of the second transistor.

In an exemplary embodiment, as shown in FIG. 9, a shape of the first electrode plate C31 of the third capacitor may be a square with a missing corner at a lower right corner.

In an exemplary embodiment, as shown in FIG. 10, the second metal layer includes: a second electrode plate C12 of the first capacitor C1, a second electrode plate C22 of the second capacitor C2, a second electrode plate C32 of the third capacitor C3, and an output signal line EL.

In an exemplary embodiment, as shown in FIG. 9, the gate electrode 22 of the second transistor has a structure with a shape of "冂".

In an exemplary embodiment, the gate electrode 92 of the ninth transistor has a comb shaped structure. The gate electrode 92 of the ninth transistor includes: multiple first branch segments 92A that are provided across the active layer 91 of the ninth transistor and a first connection segment 92B that connects the multiple first branch segments 92A.

In an exemplary embodiment, the gate electrode 120 of the tenth transistor has a comb shaped structure. The gate electrode 120 of the tenth transistor includes: multiple second branch segments 120A that are provided across the active layer 110 of the tenth transistor and a second connection segment 120B that connects the multiple first branch segments 120A.

As shown in FIG. 10, an output signal line EL in each shift register may include: a first connection portion OUT1, a second connection portion OUT2, a third connection portion OUT3, and a fourth connection portion OUT4 integrally formed. Herein, an orthographic projection of the first connection portion OUT1 on an underlay substrate is at least partially overlapped with an orthographic projection of a source electrode of the ninth transistor on the underlay substrate and is at least partially overlapped with an orthographic projection of a drain electrode of the tenth transistor on the underlay substrate, and the first connection portion OUT1 extends along a first direction. The second connection portion OUT2, the third connection portion OUT3, and the fourth connection portion OUT4 extend along a second direction, the second connection portion OUT2 and the third connection portion OUT3 are located on one side of the first connection portion OUT1 away from a first power supply line VGH, and the fourth connection portion OUT4 is located on one side of the first connection portion OUT1 close to the first power supply line VGH.

In an exemplary embodiment, the first connection portion OUT1, the second connection portion OUT2, and the third connection portion OUT3 may be of a straight line type structure. The fourth connection portion OUT4 may be of a zigzag structure.

In an exemplary embodiment, the second connection portion OUT2 is electrically connected with sub-pixels in a (2i−1)th row. The third connection portion OUT3 is electrically connected with sub-pixels in a (2i)th row. The fourth connection portion OUT4 is electrically connected with a signal input terminal of a shift register of a next stage.

In an exemplary embodiment, an orthographic projection of a connection electrode on the underlay substrate is at least partially overlapped with an orthographic projection of the fourth connection portion on the underlay substrate, and the fourth connection portion is electrically connected with a signal input terminal of a shift register of a next stage through the connection electrode.

In an exemplary embodiment, as shown in FIG. 10, a shape of the second electrode plate C12 of the first capacitor may be a square, and one side of the second electrode plate C12 of the first capacitor close to the output signal line EL is in a step shape.

In an exemplary embodiment, as shown in FIG. 10, a shape of the second electrode plate C22 of the second capacitor may be an L type lacking a lower right corner, and a protrusion is provided on an edge of the second electrode plate C22 of the second capacitor away from the output signal line EL.

In an exemplary embodiment, as shown in FIG. 10, a shape of the second electrode plate C32 of the third capacitor may be a square lacking a lower right corner, and an edge of the second electrode plate C32 of the third capacitor close to the second capacitor is in a step shape.

In an exemplary embodiment, as shown in FIG. 11, the third metal layer includes: source electrodes of multiple transistors, drain electrodes of the multiple transistors, a signal input terminal EIN, a first clock signal terminal CK1, a second clock signal terminal CK2, a first power supply line VGH, a second power supply line VGL, a first clock signal line ECK, a second clock signal line ECB, an initial signal line ESTV, and a connection electrode 40. The source electrodes of the multiple transistors include: a source electrode 13 of the first transistor T1, a source electrode 23 of the second transistor T2, a source electrode 33 of the third transistor T3, a source electrode 43 of the fourth transistor T4, a source electrode 63 of the sixth transistor T6, a source electrode 73 of the seventh transistor T7, a source electrode 83 of the eighth transistor T8, a source electrode 93 of the ninth transistor T9, and a source electrode 130 of the tenth transistor T10. The drain electrodes of the multiple transistors include: a drain electrode 14 of the first transistor T1, a drain electrode 24 of the second transistor T2, a drain electrode 34 of the third transistor T3, a drain electrode 54 of the fifth transistor T5, a drain electrode 64 of the sixth transistor T6, a drain electrode 74 of the seventh transistor T7, a drain electrode 84 of the eighth transistor T8, a drain electrode 94 of the ninth transistor T9, and a drain electrode 140 of the tenth transistor T10.

In an exemplary embodiment, the drain electrode 14 of the first transistor T1 and the source electrode 43 of the fourth transistor T4 may be of an integrally formed structure.

In an exemplary embodiment, the drain electrode 34 of the second transistor T2 and the drain electrode 34 of the third transistor T3 may be of an integrally formed structure.

In an exemplary embodiment, the source electrode 33 of the third transistor T3, the source electrode 130 of the tenth transistor T10, and the second power supply line VGL may be of an integrally formed structure.

In an exemplary embodiment, the drain electrode 64 of the sixth transistor T6 and the source electrode 73 of the seventh transistor T7 may be of an integrally formed structure.

In an exemplary embodiment, the drain electrode 74 of the seventh transistor T7 and the drain electrode 84 of the eighth transistor T8 may be of an integrally formed structure.

In an exemplary embodiment, the source electrode 83 of the eighth transistor T8, the drain electrode 94 of the ninth transistor T9, the drain electrode 54 of the fifth transistor T5, and the first power supply line VGH are of an integrally formed structure.

In an exemplary embodiment, the semiconductor layer may be an amorphous silicon layer, a poly silicon layer, or may be a metal oxide layer. The metal oxide layer may be made of an oxide containing indium and tin, an oxide containing tungsten and indium, an oxide containing tungsten and indium and zinc, an oxide containing titanium and indium, an oxide containing titanium and indium and tin, an oxide containing indium and zinc, an oxide containing silicon and indium and tin, or an oxide containing indium or gallium and zinc, etc. The metal oxide layer may be a single layer, or may be a double-layer, or may be a multi-layer.

In an exemplary embodiment, the first insulation layer, the second insulation layer, and the third insulation layer may be made of any one or more of Silicon Oxide (SiOx), Silicon Nitride (SiNx), and Silicon Oxynitride (SiON), and may be a single layer, a multi-layer, or a composite layer. The first insulation layer is called a first gate insulator, the second insulation layer is called a second gate insulator, and the third insulation layer is called an interlayer dielectric layer.

In an exemplary embodiment, the first metal layer, the second metal layer, and the third metal layer may be made of a metal material, such as any one or more of argentum (Ag), copper (Cu), aluminum (Al), and molybdenum (Mo), or an alloy material of the above metals, such as an Aluminum Neodymium alloy (AlNd) or a Molybdenum Niobium alloy (MoNb), and may be of a single-layer structure or a multi-layer composite structure, such as Mo/Cu/Mo.

In an exemplary embodiment, a resistance of the third metal layer may be less than a resistance of the first metal layer.

In an exemplary embodiment, a resistance of the third metal layer may be less than a resistance of the second metal layer.

In an exemplary embodiment, manufacturing materials of the first metal thin film and the second metal thin film may include: molybdenum.

In an exemplary embodiment, the third metal layer may be of a three-layer stacked structure formed of titanium, aluminum, and titanium.

In an exemplary embodiment, as shown in FIGS. 2, 8, and 11, in each shift register, the active layer 61 of the sixth transistor T6 extends along the first direction, and the source electrode 63 and the drain electrode 64 of the sixth transistor T6 are arranged along the first direction. The active layer 61 of the sixth transistor T6 extends along the first direction, and the source electrode 63 and the drain electrode 64 of the sixth transistor T6 are arranged along the first direction, so that the sixth transistor T6 is placed in a column direction, which may reduce a width of a drive circuit and achieve a narrow bezel of a display product.

In an exemplary embodiment, as shown in FIG. 2, a distance L1 between the first power supply line VGH and an edge of the first capacitor C1 close to the second power supply line VGL may be smaller than a distance L2 between the first power supply line VGH and the source electrode of the sixth transistor T6. The distance between the first power supply line VGH and the edge of the first capacitor C1 close to the second power supply line VGL is smaller than the distance between the first power supply line VGH and the source electrode of the sixth transistor T6, which may reduce a width of a drive circuit and achieve a narrow bezel of a display product.

In an exemplary embodiment, for each shift register, the display substrate may further include: a first via to a tenth via penetrating the first insulation layer, the second insulation layer, and the third insulation layer.

In an exemplary embodiment, the first via exposes the active layer of the first transistor, the second via exposes the active layer of the second transistor, the third via exposes the active layer of the third transistor, the fourth via exposes the active layer of the fourth transistor, the fifth via exposes the active layer of the fifth transistor, the sixth via exposes the active layer of the sixth transistor, the seventh via exposes the active layer of the seventh transistor, the eighth via exposes the active layer of the eighth transistor, the ninth via exposes the active layer of the ninth transistor, and the tenth via exposes the active layer of the tenth transistor. Herein, the source electrode and the drain electrode of the first transistor are electrically connected with the active layer of the first transistor through the first via, the source electrode and the drain electrode of the second transistor are electrically connected with the active layer of the second transistor through the second via, the source electrode and the drain electrode of the third transistor are electrically connected with the active layer of the third transistor through the third via, the source electrode and the drain electrode of the fourth transistor are electrically connected with the active layer of the fourth transistor through the fourth via, the source electrode and the drain electrode of the fifth transistor are electrically connected with the active layer of the fifth transistor through the fifth via, the source electrode and the drain electrode of the sixth transistor are electrically connected with the active layer of the sixth transistor through the sixth via, the source electrode and the drain electrode of the seventh transistor are electrically connected with the active layer of the seventh transistor through the seventh via, the source electrode and the drain electrode of the eighth transistor are electrically connected with the active layer of the eighth transistor through the eighth via, the source electrode and the drain electrode of the ninth transistor are electrically connected with the active layer of the ninth transistor through the ninth via, and the source electrode and the drain electrode of the tenth transistor are electrically connected with the active layer of the tenth transistor through the tenth via.

In an exemplary embodiment, for each shift register, the display substrate may further include: an eleventh via to a sixteenth via penetrating the second insulation layer and the third insulation layer.

In an exemplary embodiment, the eleventh via exposes the gate electrode of the first transistor, the twelfth via exposes the gate electrode of the second transistor, the thirteenth via exposes the gate electrode of the fourth transistor, the fourteenth via exposes the gate electrode of the fifth transistor, the fifteenth via exposes the gate electrode of the seventh transistor, and the sixteenth via exposes the first electrode plate of the third capacitor. Herein, the source electrode of the second transistor is electrically connected with the gate electrode of the first transistor through the eleventh via, the drain electrode of the first transistor is electrically connected with the gate electrode of the second transistor through the twelfth via, the source electrode of the sixth transistor is electrically connected with the gate electrode of the fourth transistor through the thirteenth via, the drain electrode of the third transistor is electrically connected with the gate electrode of the fifth transistor through the fourteenth via, and the drain electrode of the seventh transistor is electrically connected with the first electrode plate of the third capacitor through the sixteenth via.

In an exemplary embodiment, the eleventh via includes two, one eleventh via exposes one terminal of the gate electrode the first transistor away from the display region, and the other eleventh via exposes one terminal of the gate electrode of the first transistor close to the display region.

In an exemplary embodiment, the thirteenth via includes two, one thirteenth via exposes one terminal of the gate electrode of the fourth transistor away from the display region, and the other thirteenth via exposes one terminal of the gate electrode of the fourth transistor close to the display region.

In an exemplary embodiment, the fifteenth via exposes one terminal of the gate electrode of the seventh transistor away from the display region.

In an exemplary embodiment, for each shift register, the display substrate may further include: a seventeenth via to a twenty-first via provided on the third insulation layer.

In an exemplary embodiment, the seventeenth via exposes the second electrode plate of the first capacitor, the eighteenth via exposes the second electrode plate of the second capacitor, the nineteenth via exposes the second electrode plate of the third capacitor, the twentieth via exposes a first connection portion of a signal output terminal, and the twenty-first via exposes a fourth connection portion of the signal output terminal. Herein, the drain electrode of the sixth transistor is electrically connected with the second electrode plate of the first capacitor through the seventeenth via, the source electrode of the sixth transistor is electrically connected with the second electrode plate of the second capacitor through the eighteenth via, the drain electrode of the ninth transistor is electrically connected with the second electrode plate of the third capacitor through the nineteenth via, the source electrode of the ninth transistor and the drain electrode of the tenth transistor are electrically connected with the signal output terminal through the twentieth via, and a connection electrode is electrically connected with the signal output terminal through the twenty-first via.

In an exemplary embodiment, a quantity of seventeenth vias may be multiple. Multiple seventeenth vias are arranged along the first direction. Exemplarily, the quantity of seventeenth vias may be two.

In an exemplary embodiment, a quantity of eighteenth vias may be multiple. Multiple eighteenth vias are arranged along the first direction. Exemplarily, the quantity of eighteenth vias may be two.

In an exemplary embodiment, a quantity of nineteenth vias may be multiple, and the multiple nineteenth vias are arranged along the second direction. Exemplarily, the quantity of nineteenth vias may be four. The multiple nineteenth vias are arranged along the second direction, which may reduce a width of a drive circuit and achieve a narrow bezel.

In an exemplary embodiment, a quantity of twentieth vias may be multiple. Exemplarily, the quantity of twentieth vias may be twelve. The multiple twentieth vias are arranged along the first direction.

A structure of a display substrate will be described below through an example of a preparation process of the display substrate. A "patterning process" mentioned in the present disclosure includes processes, such as deposition of a film layer, photoresist coating, masking and exposure, development, etching, and photoresist stripping. Deposition may be any one or more of sputtering, evaporation, and chemical vapor deposition. Coating may be any one or more of spray coating and spin coating. Etching may be any one or more of dry etching and wet etching. A "thin film" refers to a layer of a thin film made of a material on a base substrate using a process of deposition or coating. If a patterning process is not needed for the "thin film" during a whole preparation process, the "thin film" may also be referred to as a "layer". When a patterning process is needed for the "thin film" during the whole preparation process, the thin film is referred to as a "thin film" before the patterning process and referred to as a "layer" after the patterning process. The "layer" after the patterning process includes at least one "pattern". "A and B are disposed in a same layer" mentioned in the present disclosure means that A and B are simultaneously formed through a same patterning process.

FIG. 12 to FIG. 16 are schematic diagrams of a preparation process of a display substrate according to an exemplary embodiment. As shown in FIG. 12 to FIG. 16, the preparation process of the display substrate according to the exemplary embodiment may include following contents.

Figure 12:
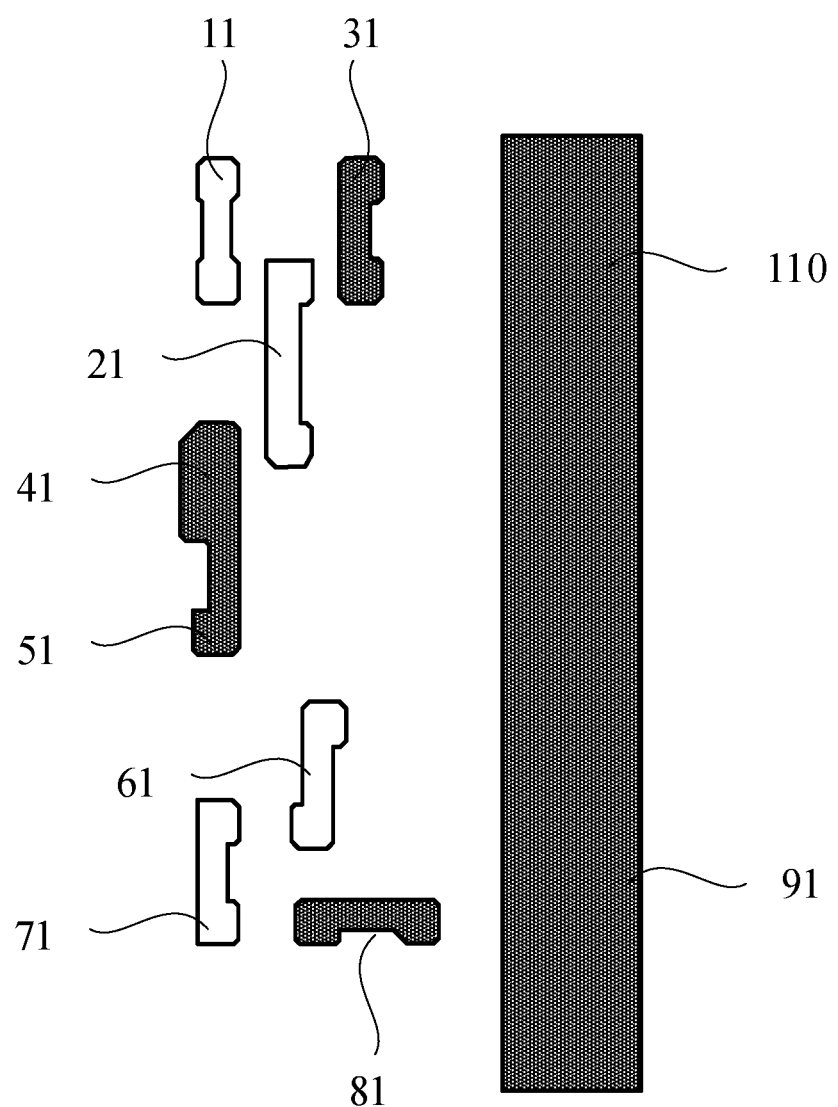
FIG. 12 is a schematic diagram of a display substrate of the present disclosure after a pattern of a semiconductor layer is formed.

(1) A pattern of a semiconductor layer is formed on an underlay substrate, which includes: a semiconductor thin film is deposited on the underlay substrate, and the semiconductor thin film is patterned through a patterning process to form the pattern of the semiconductor layer. As shown in FIG. 12, the semiconductor layer includes an active layer 11 of a first transistor T1, an active layer 21 of a second transistor T2, an active layer 31 of a third transistor T3, an active layer 41 of a fourth transistor T4, an active layer 51 of a fifth transistor T5, an active layer 61 of a sixth transistor T6, an active layer 71 of a seventh transistor T7, an active layer 81 of an eighth transistor T8, an active layer 91 of a ninth transistor T9, and an active layer 110 of a tenth transistor T10. As shown in FIG. 12, FIG. 12 is a schematic diagram of a display substrate of the present disclosure after a pattern of a semiconductor layer is formed.

Herein, the active layer 11 of the first transistor T1, the active layer 21 of the second transistor T2, the active layer 31 of the third transistor T3, the active layer 41 of the fourth transistor T4, the active layer 51 of the fifth transistor T5, the active layer 61 of the sixth transistor T6, and the active layer 71 of the seventh transistor T7 extend along a first direction. The active layer 81 of the eighth transistor T8 extends along a second direction. The active layer 91 of the ninth transistor T9 and the active layer 110 of the tenth transistor T10 extend along the first direction, and are of a long strip shaped structure integrally formed.

Figure 13:
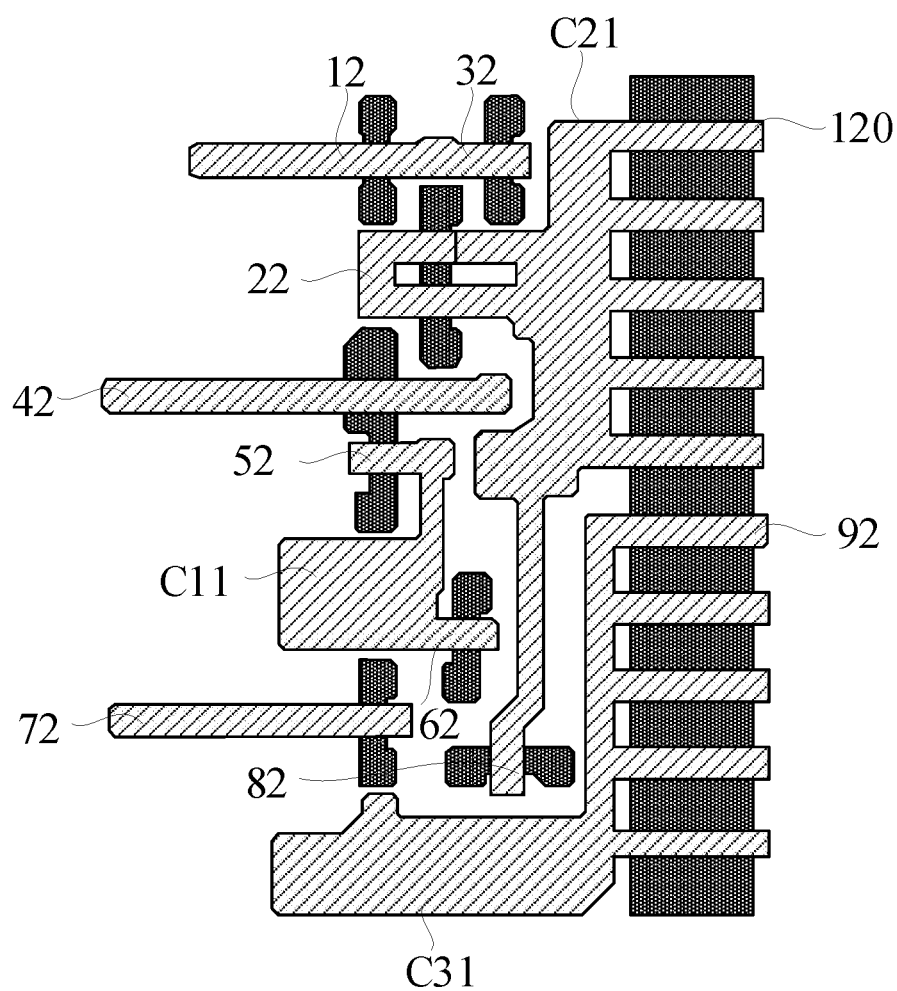
FIG. 13 is a schematic diagram of a display substrate of the present disclosure after a pattern of a first metal layer is formed.

(2) A pattern of a first metal layer is formed, which includes: a first insulation thin film and a first metal thin film are sequentially deposited on a base substrate on which the aforementioned pattern is formed, and the first insulation thin film and the first metal thin film are patterned through a patterning process to form a pattern of a first insulation layer and a pattern of a first metal layer located on the first insulation layer, wherein the first metal layer includes a first electrode plate C11 of a first capacitor C1, a first electrode plate C21 of a second capacitor C2, a first electrode plate C31 of a third capacitor C3, a gate electrode 12 of the first transistor T1, a gate electrode 22 of the second transistor T2, a gate electrode 32 of the third transistor T3, a gate electrode 42 of the fourth transistor T4, a gate electrode 52 of the fifth transistor T5, a gate electrode 62 of the sixth transistor T6, a gate electrode 72 of the seventh transistor T7, a gate electrode 82 of the eighth transistor T8, a gate electrode 92 of the ninth transistor T9, and a gate electrode 120 of the tenth transistor T10, as shown in FIG. 13, which is a schematic diagram of a display substrate of the present disclosure after a pattern of a first metal layer is formed.

Each gate electrode is provided across an active layer of a corresponding transistor, that is, an extension direction of each gate electrode is perpendicular to an extension direction of the active layer of the corresponding transistor.

In an exemplary embodiment, the gate electrode 22 of the second transistor T2, the gate electrode 120 of the tenth transistor T10, the gate electrode 82 of the eighth transistor T8, and the first electrode plate C21 of the second capacitor C2 are of an integrally formed structure. The gate electrode 52 of the fifth transistor T5, the gate electrode 62 of the sixth transistor T6, and the first electrode plate C11 of the first capacitor C1 are of an integrally formed structure. The gate electrode 92 of the ninth transistor T9 and the first electrode plate C31 of the third capacitor C3 are of an integrally formed structure.

In an exemplary embodiment, this process further includes a conductive processing. The conductive processing is as follows: after the pattern of the first metal layer is formed, the semiconductor layer in a region shielded by the gate electrode 12 of the first transistor T1, the gate electrode 22 of the second transistor T2, the gate electrode 32 of the third transistor T3, the gate electrode 42 of the fourth transistor T4, the gate electrode 52 of the fifth transistor T5, the gate electrode 62 of the sixth transistor T6, the gate electrode 72 of the seventh transistor T7, the gate electrode 82 of the eighth transistor T8, the gate electrode 92 of the ninth transistor T9, and the gate electrode 120 of the tenth transistor T10 (i.e., a region where the semiconductor layer is overlapped with each gate electrode) is used as a channel region of a transistor, and the semiconductor layer in a region not shielded by the first metal layer is processed into a conductive layer to form a conductive source and drain connection portion.

Figure 14:
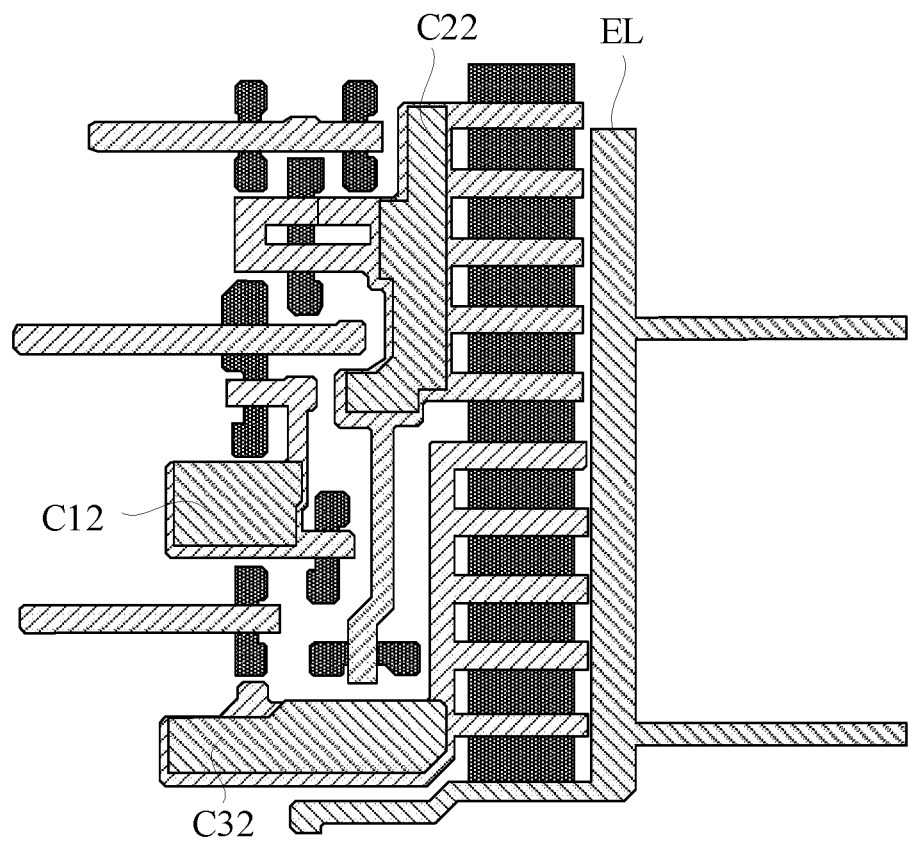
FIG. 14 is a schematic diagram of a display substrate of the present disclosure after a pattern of a second metal layer is formed.

(3) A pattern of a second metal layer is formed, which includes: a second insulation thin film and a second metal thin film are sequentially deposited on the base substrate on which the aforementioned patterns are formed, and the second insulation thin film and the second metal thin film are patterned through a patterning process to form a pattern of a second insulation layer and a pattern of a second metal layer located on the second insulation layer. The second metal layer includes: a second electrode plate C12 of the first capacitor C1, a second electrode plate C22 of the second capacitor C2, a second electrode plate C32 of the third capacitor C3, and an output signal line EL, as shown in FIG. 14, which is a schematic diagram of a display substrate of the present disclosure after a pattern of a second metal layer is formed.

Figure 15:
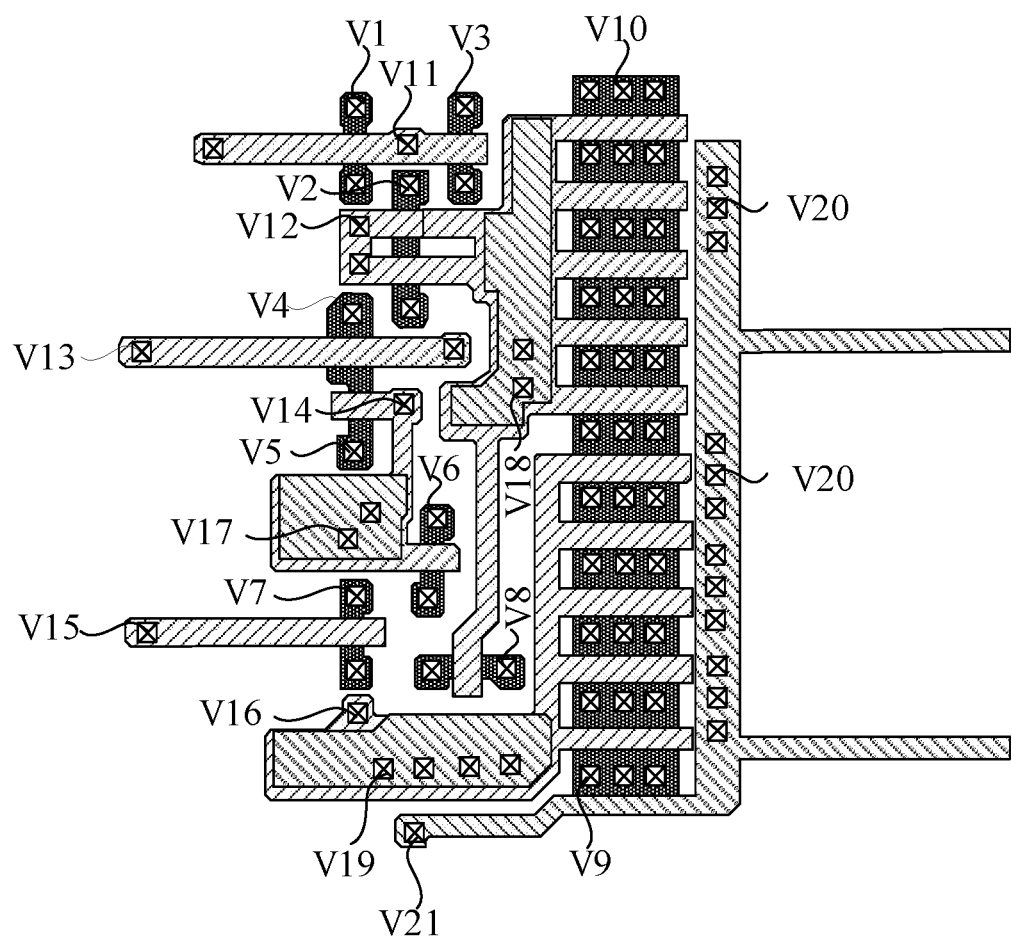
FIG. 15 is a schematic diagram of a display substrate of the present disclosure after a pattern of a third insulation layer is formed.

(4) A pattern of a third insulation layer is formed, which includes: a third insulation thin film is deposited on the base substrate on which the aforementioned patterns are formed, and the third insulation thin film is patterned through a patterning process to form the pattern of the third insulation layer covering the aforementioned structure, wherein the third insulation layer is opened with a pattern of multiple vias, the pattern of the multiple vias includes a first via V1 to a tenth via V10 penetrating the first insulation layer, the second insulation layer, and the third insulation layer, an eleventh via V11 to a sixteenth via V16 penetrating the second insulation layer and the third insulation layer, and a seventeenth via V17 to a twenty-first via V21 provided on the third insulation layer, as shown in FIG. 15, which is a schematic diagram of a display substrate of the present disclosure after a pattern of a third insulation layer is formed.

In an exemplary embodiment, the first via V1 exposes the active layer 11 of the first transistor, the second via V2 exposes the active layer 21 of the second transistor, the third via V3 exposes the active layer 31 of the third transistor, the fourth via V4 exposes the active layer 41 of the fourth transistor, the fifth via V5 exposes the active layer 51 of the fifth transistor, the sixth via V6 exposes the active layer 61 of the sixth transistor, the seventh via V7 exposes the active layer 71 of the seventh transistor, the eighth via V8 exposes the active layer 81 of the eighth transistor, the ninth via V9 exposes the active layer 91 of the ninth transistor, and the tenth via V10 exposes the active layer 110 of the tenth transistor. The eleventh via V11 exposes the gate electrode 12 of the first transistor, the twelfth via V12 exposes the gate electrode 22 of the second transistor, the thirteenth via V13 exposes the gate electrode 42 of the fourth transistor, the fourteenth via V14 exposes the gate electrode 52 of the fifth transistor, the fifteenth via V15 exposes the gate electrode 72 of the seventh transistor, and the sixteenth via V16 exposes the first electrode plate C31 of the third capacitor. The seventeenth via V17 exposes the second electrode plate C12 of the first capacitor, the eighteenth via V18 exposes the second electrode plate C22 of the second capacitor, the nineteenth via V19 exposes the second electrode plate C32 of the third capacitor, the twentieth via V20 exposes a first connection portion of the output signal line EL, and the twenty-first via V21 exposes a fourth connection portion of the output signal line EL.

Figure 16:
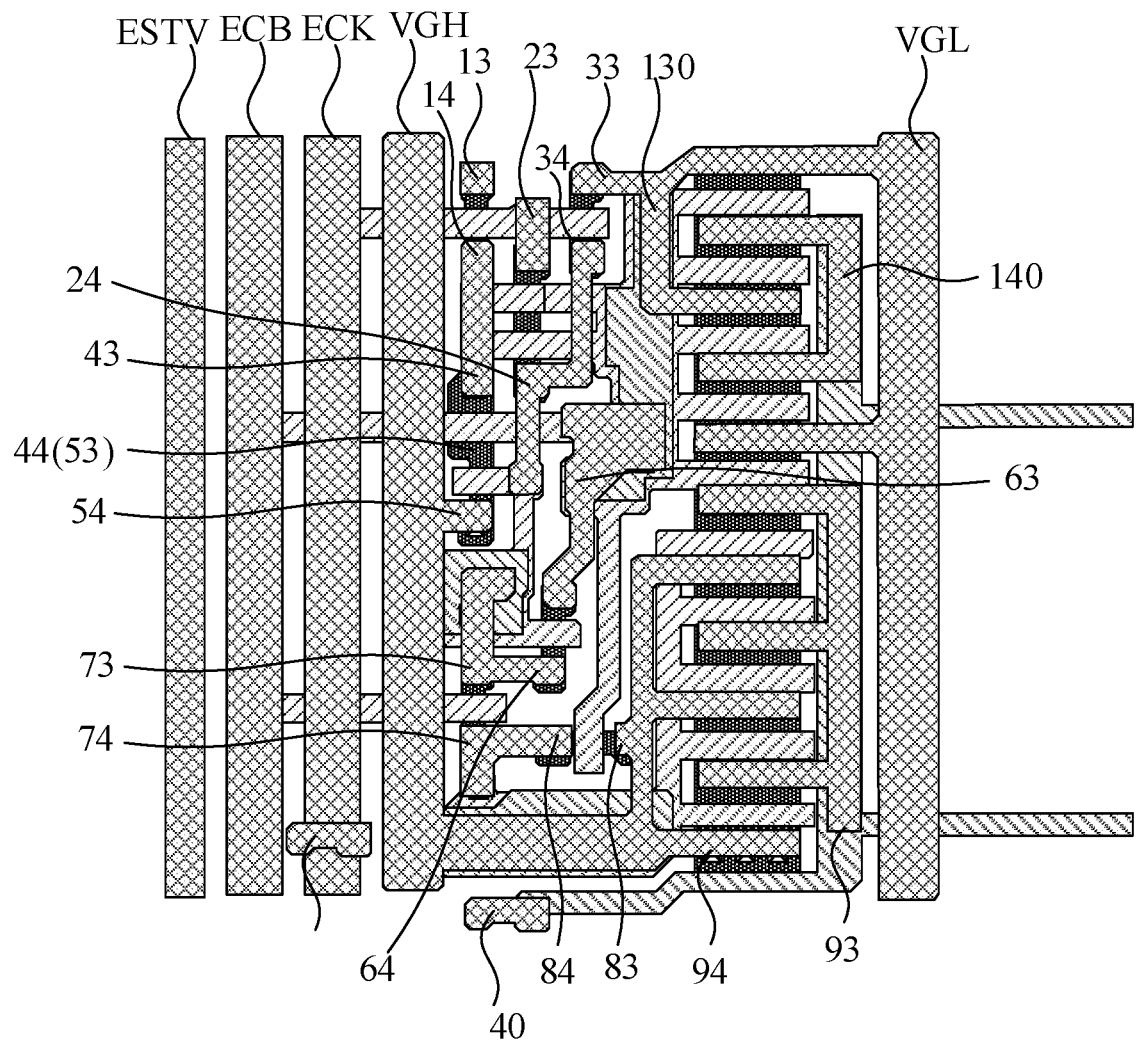
FIG. 16 is a schematic diagram of a display substrate in an exemplary embodiment of the present disclosure.

(4) A pattern of a third metal layer is formed, which includes: a third metal thin film is deposited on the base substrate on which the aforementioned patterns are formed, and the third metal thin film is patterned through a patterning process to form the pattern of the third metal layer. The third metal layer includes: a first power supply line VGH, a second power supply line VGL, a first clock signal line ECK, a second clock signal line ECB, an initial signal line ESTV, a connection electrode 40, a source electrode 13 of the first transistor T1, a source electrode 23 of the second transistor T2, a source electrode 33 of the third transistor T3, a source electrode 43 of the fourth transistor T4, a source electrode 63 of the sixth transistor T6, a source electrode 73 of the seventh transistor T7, a source electrode 83 of the eighth transistor T8, a source electrode 93 of the ninth transistor T9, a source electrode 130 of the tenth transistor T10, a drain electrode 14 of the first transistor T1, a drain electrode 24 of the second transistor T2, a drain electrode 34 of the third transistor T3, a drain electrode 54 of the fifth transistor T5, a drain electrode 64 of the sixth transistor T6, a drain electrode 74 of the seventh transistor T7, a drain electrode 84 of the eighth transistor T8, a drain electrode 94 of the ninth transistor T9, and a drain electrode 140 of the tenth transistor T10, as shown in FIG. 16, which is a schematic diagram of a display substrate in an exemplary embodiment of the present disclosure.

In an exemplary embodiment, the drain electrode 14 of the first transistor T1 and the source electrode 43 of the fourth transistor T4 are of an integrally formed structure. The drain electrode 24 of the second transistor T2 and the drain electrode 34 of the third transistor T3 are of an integrally formed structure. The source electrode 33 of the third transistor T3, the source electrode 130 of the tenth transistor T10, and the second power supply line VGL are of an integrally formed structure. The drain electrode 64 of the sixth transistor T6 and the source electrode 73 of the seventh transistor T7 are of an integrally formed structure. The drain electrode 74 of the seventh transistor T7 and the drain electrode 84 of the eighth transistor T8 are of an integrally formed structure. The source electrode 83 of the eighth transistor T8, the drain electrode 94 of the ninth transistor T9, the drain electrode 54 of the fifth transistor T5, and the first power supply line VGH are of an integrally formed structure.

In an exemplary embodiment, the source electrode 13 and the drain electrode 14 of the first transistor are electrically connected with the active layer 11 of the first transistor through the first via V1. The source electrode 23 and the drain electrode 24 of the second transistor are electrically connected with the active layer 21 of the second transistor through the second via V2. The source electrode 33 and the drain electrode 34 of the third transistor are electrically connected with the active layer 31 of the third transistor through the third via V3. The source electrode 43 and the drain electrode 44 of the fourth transistor are electrically connected with the active layer 41 of the fourth transistor through the fourth via V4. The source electrode 53 and the drain electrode 54 of the fifth transistor are electrically connected with the active layer of the fifth transistor through the fifth via V5. The source electrode 63 and the drain electrode 64 of the sixth transistor are electrically connected with the active layer 61 of the sixth transistor through the sixth via V6. The source electrode 73 and the drain electrode 74 of the seventh transistor are electrically connected with the active layer 71 of the seventh transistor through the seventh via V7. The source electrode 83 and the drain electrode 84 of the eighth transistor are electrically connected with the active layer 81 of the eighth transistor through the eighth via V8. The source electrode 93 and the drain electrode 94 of the ninth transistor are electrically connected with the active layer of the ninth transistor through the ninth via V9, and the source electrode 130 and the drain electrode 140 of the tenth transistor are electrically connected with the active layer 110 of the tenth transistor through the tenth via V10. The first clock signal line ECK is electrically connected with the gate electrode 12 of the first transistor through the eleventh via V11. The source electrode 23 of the second transistor is electrically connected with the gate electrode 12 of the first transistor through the eleventh via V11. The drain electrode 14 of the first transistor is electrically connected with the gate electrode 22 of the second transistor through the twelfth via V12. The second clock signal line ECB is electrically connected with the gate electrode 42 of the fourth transistor through the thirteenth via V13. The source electrode 63 of the sixth transistor is electrically connected with the gate electrode 42 of the fourth transistor through the thirteenth via V13. The drain electrode 34 of the third transistor is electrically connected with the gate electrode 52 of the fifth transistor through the fourteenth via V14. The second clock signal line ECB is electrically connected with the gate electrode 72 of the seventh transistor through the fifteenth via V15. The drain electrode 74 of the seventh transistor is electrically connected with the first electrode plate C31 of the third capacitor through the sixteenth via V16. The drain electrode 64 of the sixth transistor is electrically connected with the second electrode plate C12 of the first capacitor through the seventeenth via V17. The source electrode 63 of the sixth transistor is electrically connected with the second electrode plate C22 of the second capacitor through the eighteenth via V18. The drain electrode 94 of the ninth transistor is electrically connected with the second electrode plate C32 of the third capacitor through the nineteenth via V19. The source electrode 93 of the ninth transistor and the drain electrode 140 of the tenth transistor are electrically connected with the first connection portion of the signal output terminal through the twentieth via V20. The connection electrode 40 is electrically connected with the fourth connection portion of the signal output terminal through the twenty-first via V21. FIG. 16 is illustrated by taking a first clock signal terminal of a shift register being electrically connected with a first clock signal line and a second clock signal terminal of the shift register being electrically connected with a second clock signal line as an example.

For different display products, cascade relationships of multiple shift registers in a drive circuit may be different. Regardless of a cascade relationship of the multiple shift registers and how many rows of sub-pixels are driven by each shift register, possible simple translation and stretching of a small device are all within the protection scope of the present disclosure as long as after a device with a large area like this is changed and such a change generates additional space.

An embodiment of the present disclosure further provides a display apparatus, which may include: a display substrate.

The display substrate is the display substrate according to any of the aforementioned embodiments, and has similar implementation principles and implementation effects, which will not be repeated here.

In an exemplary embodiment, the display apparatus may be a Liquid Crystal Display (LCD for short) or an Organic Light Emitting Diode (OLED for short) display apparatus. The display apparatus may be any product or component with a display function, such as a liquid crystal panel, electronic paper, an OLED panel, an Active-Matrix Organic Light Emitting Diode (AMOLED for short) panel, a mobile phone, a tablet computer, a television, a display, a notebook computer, a digital photo frame, or a navigator.

An embodiment of the present disclosure further provides a preparation method of a display substrate, configured to prepare the display substrate. The preparation method of the display substrate according to the embodiment of the present disclosure includes following acts S1 to S2.

In the act S1, an underlay substrate is provided.

In an exemplary embodiment, the underlay substrate may be a rigid base substrate or a flexible base substrate, wherein the rigid base substrate may be, but is not limited to, one or more of glass and a metal foil sheet; the flexible base substrate may be, but is not limited to, one or more of polyethylene terephthalate, ethylene terephthalate, polyether ether ketone, polystyrene, polycarbonate, polyarylate, polyarylester, polyimide, polyvinyl chloride, polyethylene, and a textile fiber.

In the act S2, a drive circuit and a first power supply line located in a non-display region are formed on the underlay substrate.

In an exemplary embodiment, the drive circuit includes a first capacitor, a second capacitor, and a third capacitor; the first capacitor and the third capacitor are arranged along a first direction, the second capacitor and the third capacitor are respectively located on both sides of the first capacitor, the second capacitor is located on one side of the first capacitor close to a display region, and one electrode plate of the third capacitor is electrically connected with the first power supply line. The first power supply line extends along the first direction, and an orthographic projection of the first capacitor on the underlay substrate is at least partially overlapped with an orthographic projection of the first power supply line on the underlay substrate.

The display substrate is the display substrate according to any of the aforementioned embodiments, and has similar implementation principles and implementation effects, which will not be repeated here.

In an exemplary embodiment, the drive circuit includes multiple shift registers, wherein each shift register includes multiple transistors, and a first capacitor to a third capacitor, and the act S2 may include following acts S21 to S24.

In the act S21, a semiconductor layer is formed on the underlay substrate. Herein, the semiconductor layer includes: active layers of multiple transistors.

In an exemplary embodiment, the semiconductor layer may be an amorphous silicon layer, a poly silicon layer, or may be a metal oxide layer. The metal oxide layer may be made of an oxide containing indium and tin, an oxide containing tungsten and indium, an oxide containing tungsten and indium and zinc, an oxide containing titanium and indium, an oxide containing titanium and indium and tin, an oxide containing indium and zinc, an oxide containing silicon and indium and tin, or an oxide containing indium or gallium and zinc, etc. The metal oxide layer may be a single layer, or a double-layer, or may be a multi-layer.

In the act S22, a first insulation layer and a first metal layer are sequentially formed on the semiconductor layer. Herein, the first metal layer includes: gate electrodes of the multiple transistors, a first electrode plate of the first capacitor, a first electrode plate of the second capacitor, and a first electrode plate of the third capacitor.

In an exemplary embodiment, the first metal layer may be made of a metal material, such as any one or more of argentum (Ag), copper (Cu), aluminum (Al), and molybdenum (Mo), or an alloy material of the above metals, such as an Aluminum Neodymium alloy (AlNd) or a Molybdenum Niobium alloy (MoNb), and may be of a single-layer structure or a multi-layer composite structure, such as Mo/Cu/Mo. Exemplarily, a manufacturing material of the first metal layer may include: molybdenum.

In the act S23, a second insulation layer and a second metal layer are sequentially formed on the first metal layer. Herein, the second metal layer includes: a second electrode plate of the first capacitor, a second electrode plate of the second capacitor, a second electrode plate of the third capacitor, and a signal output terminal.

In an exemplary embodiment, the second metal layer may be made of a metal material, such as any one or more of argentum (Ag), copper (Cu), aluminum (Al), and molybdenum (Mo), or an alloy material of the above metals, such as an Aluminum Neodymium alloy (AlNd) or a Molybdenum Niobium alloy (MoNb), and may be of a single-layer structure or a multi-layer composite structure, such as Mo/Cu/Mo. Exemplarily, a manufacturing material of the second metal layer may include: molybdenum.

In the act S24, a third insulation layer and a third metal layer are sequentially formed on the second metal layer. Herein, the third metal layer includes: source electrodes of the multiple transistors, drain electrodes of the multiple transistors, the first power supply line, a second power supply line, a first clock signal line, a second clock signal line, an initial signal line, and a connection electrode.

In an exemplary embodiment, the third metal layer may be made of a metal material, such as any one or more of argentum (Ag), copper (Cu), aluminum (Al), and molybdenum (Mo), or an alloy material of the above metals, such as an Aluminum Neodymium alloy (AlNd) or a Molybdenum Niobium alloy (MoNb), and may be of a single-layer structure or a multi-layer composite structure, such as Mo/Cu/Mo. Exemplarily, the third metal layer may be of a three-layer stacked structure formed of titanium, aluminum, and titanium.

In an exemplary embodiment, the first insulation layer, the second insulation layer, and the third insulation layer may be made of any one or more of Silicon Oxide (SiOx), Silicon Nitride (SiNx), and Silicon Oxynitride (SiON), and may be a single layer, a multi-layer, or a composite layer. The first insulation layer is called a first gate insulator, the second insulation layer is called a second gate insulator, and the third insulation layer is called an interlayer dielectric layer.

The accompanying drawings of the present disclosure only involve structures involved in the embodiments of the present disclosure, and other structures may refer to usual designs.

For the sake of clarity, in the accompanying drawings used for describing the embodiments of the present disclosure, a thickness and a dimension of a layer or a micro structure is enlarged. It may be understood that when an element such as a layer, a film, a region, or a substrate is referred to as being "on" or "under" another element, the element may be "directly" located "on" or "under" the another element, or there may be an intermediate element.

Although the implementation modes disclosed in the present disclosure are as above, the described contents are only implementation modes used for convenience of understanding the present disclosure and are not intended to limit the present disclosure. Any person skilled in the art to which the present disclosure pertains may make any modification and variation in implementation forms and details without departing from the spirit and scope disclosed in the present disclosure. However, the scope of patent protection of the present disclosure is still subject to the scope defined by the appended claims.

The invention claimed is:

1. A display substrate, comprising: a display region and a non-display region, and comprising: an underlay substrate, and a drive circuit and a first power supply line which are disposed on the underlay substrate and located in the non-display region, wherein the drive circuit at least comprises a first capacitor, a second capacitor, and a third capacitor; the first capacitor and the third capacitor are arranged along a first direction, the second capacitor and the third capacitor are respectively located on both sides of the first capacitor, the second capacitor is located on one side of the first capacitor close to the display region, and one electrode plate of the third capacitor is electrically connected with the first power supply line; wherein the first power supply line extends along the first direction, and an orthographic projection of the first capacitor on the under lay substrate is at least partially overlapped with an orthographic projection of the first power supply line on the underlay substrate; wherein the display substrate further comprises: a second power supply line, an initial signal line, a first clock signal line, and a second clock signal line which are disposed on the underlay substrate and located in the non-display region; wherein the second power supply line is located on one side of the drive circuit close to the display region and extends along the first direction, the initial signal line is located on one side of the first power supply line away from the display region and extends along the first direction, the first clock signal line is located between the first power supply line and the initial signal line and extends along the first direction, and the second clock signal line is located between the first clock signal line and the initial signal line and extends along the first direction; and wherein a width of the second power supply line is less than or equal to a width of the first power supply line, and/or a width of the initial signal line is less than a width of the first power supply line, and/or a width of the first clock signal line is less than the width of the first power supply line and greater than the width of the initial signal line, and/or a width of the second clock signal line is less than the width of the first power supply line and greater than the width of the initial signal line.

2. The display substrate according to claim 1, wherein an orthographic projection of the third capacitor on the underlay substrate is at least partially overlapped with the orthographic projection of the first power supply line on the underlay substrate.

3. The display substrate according to claim 1, wherein the drive circuit comprises: multiple shift registers arranged along the first direction, where in each shift register comprises a first transistor to a tenth transistor, a first capacitor to a third capacitor, a signal input terminal, a signal output terminal, a first clock signal terminal, a second clock signal terminal, a first power supply terminal, and a second power supply terminal;
  a gate electrode of the first transistor is electrically connected with the first clock signal terminal, a source electrode of the first transistor is electrically connected with the signal input terminal, and a drain electrode of the first transistor is electrically connected with a first node;
  a gate electrode of the second transistor is electrically connected with the first node, a source electrode of the second transistor is electrically connected with the first clock signal terminal, and a second electrode of the second transistor is electrically connected with a second node;
  a gate electrode of the third transistor is electrically connected with the first clock signal terminal, a source electrode of the third transistor is electrically connected with the second power supply terminal, and a second electrode of the third transistor is electrically connected with the second node;
  a gate electrode of the fourth transistor is electrically connected with the second clock signal terminal, a source electrode of the fourth transistor is electrically connected with the first node, and a drain electrode of the fourth transistor is electrically connected with a source electrode of the fifth transistor;
  a gate electrode of the fifth transistor is electrically connected with the second node, and a drain electrode of the fifth transistor is electrically connected with the first power supply terminal;
  a gate electrode of the sixth transistor is electrically connected with the second node, a source electrode of the sixth transistor is electrically connected with the second clock signal terminal, and a drain electrode of the sixth transistor is electrically connected with a third node;
  a gate electrode of the seventh transistor is electrically connected with the second clock signal terminal, a source electrode of the seventh transistor is electrically connected with the third node, and a drain electrode of the seventh transistor is electrically connected with a fourth node;

a gate electrode of the eighth transistor is electrically connected with the first node, a source electrode of the eighth transistor is electrically connected with the first power supply terminal, and a drain electrode of the eighth transistor is electrically connected with the fourth node;

a gate electrode of the ninth transistor is electrically connected with the fourth node, a source electrode of the ninth transistor is electrically connected with the signal output terminal, and a drain electrode of the ninth transistor is electrically connected with the first power supply terminal;

a gate electrode of the tenth transistor is electrically connected with the first node, a source electrode of the tenth transistor is electrically connected with the second power supply terminal, and a drain electrode of the tenth transistor is electrically connected with the signal output terminal;

a first electrode plate of the first capacitor is electrically connected with the second node, and a second electrode plate of the first capacitor is electrically connected with the third node;

a first electrode plate of the second capacitor is electrically connected with the first node, and a second electrode plate of the second capacitor is electrically connected with the second clock signal terminal;

a first electrode plate of the third capacitor is electrically connected with the fourth node, and a second electrode plate of the third capacitor is electrically connected with the first power supply terminal.

4. The display substrate according to claim 3, wherein the first electrode plate of the first capacitor is located on one side of the second electrode plate of the first capacitor close to the underlay substrate, and an orthographic projection of the first electrode plate of the first capacitor on the underlay substrate covers an orthographic projection of the second electrode plate of the first capacitor on the underlay substrate;

the first electrode plate of the second capacitor is located on one side of the second electrode plate of the second capacitor close to the underlay substrate, and an orthographic projection of the first electrode plate of the second capacitor on the underlay substrate covers an orthographic projection of the second electrode plate of the second capacitor on the underlay substrate;

the first electrode plate of the third capacitor is located on one side of the second electrode plate of the third capacitor close to the underlay substrate, and an orthographic projection of the first electrode plate of the third capacitor on the underlay substrate covers an orthographic projection of the second electrode plate of the third capacitor on the underlay substrate;

wherein an area of an overlapping portion of the orthographic projection of the first electrode plate of the first capacitor on the underlay substrate and the orthographic projection of the first power supply line on the underlay substrate is positively related to an area of the first electrode plate of the first capacitor, and an area of an overlapping portion of the orthographic projection of the first electrode plate of the third capacitor on the underlay substrate and the orthographic projection of the first power supply line on the underlay substrate is positively related to an area of the first electrode plate of the third capacitor; and an area of an overlapping portion of the first electrode plate of the first capacitor and the first power supply line is smaller than an area of an overlapping portion of the first electrode plate of the third capacitor and the first power supply line.

5. The display substrate according to claim 3, wherein the multiple shift registers in the drive circuit are cascaded, a signal input terminal of a first-stage shift register is electrically connected with the initial signal line, a signal output terminal of an (i−1)th-stage shift register is electrically connected with a signal input terminal of an ith-stage shift register, first power supply terminals of all the shift registers are electrically connected with the first power supply line, second power supply terminals of the shift registers are electrically connected with the second power supply line, a first clock signal terminal of an odd-stage shift register is electrically connected with the first clock signal line, a second clock signal terminal of the odd-stage shift register is electrically connected with the second clock signal line, a first clock signal terminal of an even-stage shift register is electrically connected with the second clock signal line, a second clock signal terminal of the even-stage shift register is electrically connected with the first clock signal line, wherein i is a positive integer greater than or equal to 2.

6. The display substrate according to claim 5, further comprising: sub-pixels arranged in array, disposed on the underlay substrate, and located in the display region;

a signal output terminal of the ith-stage shift register is electrically connected with sub-pixels in a (2i−1)th row and sub-pixels in a (2i)th row.

7. The display substrate according to claim 3, wherein each shift register comprises: a connection electrode and an output signal line disposed in different layers;

the output signal line is electrically connected with a signal output terminal of a shift register of a present stage, and an orthographic projection of the connection electrode on the underlay substrate is at least partially overlapped with an orthographic projection of the output signal line on the underlay substrate; and the connection electrode is electrically connected with the signal output terminal of the shift register of the present stage and a signal input terminal of a shift register of a next stage respectively.

8. The display substrate according to claim 7, wherein the display substrate comprises: a semiconductor layer, a first insulation layer, a first metal layer, a second insulation layer, a second metal layer, a third insulation layer, and a third metal layer which are sequentially stacked on the underlay substrate;

the semiconductor layer comprises active layers of multiple transistors, the first metal layer comprises gate electrodes of the multiple transistors, the first electrode plate of the first capacitor, the first electrode plate of the second capacitor, and the first electrode plate of the third capacitor, the second metal layer comprises the second electrode plate of the first capacitor, the second electrode plate of the second capacitor, the second electrode plate of the third capacitor, and the output signal line, the third metal layer comprises source electrodes of the multiple transistors, drain electrodes of the multiple transistors, the first power supply line, the second power supply line, the first clock signal line, the second clock signal line, the initial signal line, and the connection electrode;

a resistance of the third metal layer is less than a resistance of the first metal layer and less than a resistance of the second metal layer.

9. The display substrate according to claim 8, wherein in each shift register, active layers of all transistors comprise: a channel region, and a source connection portion and a drain connection portion located on both sides of the channel region, wherein a source electrode of a transistor is electrically connected with the source connection portion, and a drain electrode of the transistor is electrically connected with the drain connection portion;
    a drain connection portion of an active layer of the fourth transistor is multiplexed as a drain electrode, a source connection portion of an active layer of the fifth transistor is multiplexed as a source electrode, and the drain connection portion of the active layer of the fourth transistor is electrically connected with the source connection portion of the active layer of the fifth transistor.

10. The display substrate according to claim 8, wherein in each shift register, the gate electrode of the second transistor, the gate electrode of the tenth transistor, the gate electrode of the eighth transistor, and the first electrode plate of the second capacitor are of an integrally formed structure, the gate electrode of the fifth transistor, the gate electrode of the sixth transistor, and the first electrode plate of the first capacitor are of an integrally formed structure, and the gate electrode of the ninth transistor and the first electrode plate of the third capacitor are of an integrally formed structure;
    the drain electrode of the first transistor and the source electrode of the fourth transistor are of an integrally formed structure, the drain electrode of the second transistor and the drain electrode of the third transistor are of an integrally formed structure, the source electrode of the third transistor, the source electrode of the tenth transistor, and the second power supply line are of an integrally formed structure, the drain electrode of the sixth transistor and the source electrode of the seventh transistor are of an integrally formed structure, the drain electrode of the seventh transistor and the drain electrode of the eighth transistor are of an integrally formed structure, and the source electrode of the eighth transistor, the drain electrode of the ninth transistor, the drain electrode of the fifth transistor, and the first power supply line are of an integrally formed structure.

11. The display substrate according to claim 8, wherein the first transistor, the second transistor, the third transistor, the fourth transistor, and the fifth transistor are located on one side of the first capacitor away from the third capacitor and on one side of the second capacitor close to the first power supply line; the sixth transistor is located on one side of the first capacitor close to the second power supply line and on one side of the second capacitor close to the third capacitor, the seventh transistor and the eighth transistor are located between the first capacitor and the third capacitor, and the ninth transistor and the tenth transistor are located on one side of the second capacitor close to the second power supply line-;
    or,
    wherein in each shift register, active layers of the first transistor, the second transistor, the third transistor, the fourth transistor, the fifth transistor, the sixth transistor, the seventh transistor, the ninth transistor, and the tenth transistor extend along the first direction, an active layer of the eighth transistor extends along a second direction, and the source electrode and the drain electrode of the sixth transistor are arranged along the first direction; and
    the first direction intersects with the second direction.

12. The display substrate according to claim 7, wherein a distance between the first power supply line and an edge of the first capacitor close to the second power supply line is less than a distance between the first power supply line and the source electrode of the sixth transistor.

13. The display substrate according to claim 7, wherein the output signal line in each shift register comprises: a first connection portion, a second connection portion, a third connection portion, and a fourth connection portion which are integrally formed;
    an orthographic projection of the first connection portion on the underlay substrate is at least partially overlapped with an orthographic projection of the source electrode of the ninth transistor on the underlay substrate and is at least partially overlapped with an orthographic projection of the drain electrode of the tenth transistor on the underlay substrate, and the first connection portion extends along the first direction;
    the second connection portion, the third connection portion, and the fourth connection portion extend along a second direction, the second connection portion and the third connection portion are located on one side of the first connection portion away from the first power supply line, and the fourth connection portion is located on one side of the first connection portion close to the first power supply line;
    the second connection portion is electrically connected with sub-pixels in a (2i−1)th row, and the third connection portion is electrically connected with sub-pixels in a (2i)th row; the fourth connection portion is electrically connected with the signal input terminal of the shift register of the next stage;
    the orthographic projection of the connection electrode on the underlay substrate is at least partially overlapped with an orthographic projection of the fourth connection portion on the underlay substrate, and the fourth connection portion is electrically connected with the signal input terminal of the shift register of the next stage through the connection electrode.

14. The display substrate according to claim 8, wherein for each shift register, the display substrate further comprises: a first via to a tenth via penetrating the first insulation layer, the second insulation layer, and the third insulation layer;
    the first via exposes an active layer of the first transistor, the second via exposes an active layer of the second transistor, the third via exposes an active layer of the third transistor, the fourth via exposes an active layer of the fourth transistor, the fifth via exposes an active layer of the fifth transistor, the sixth via exposes an active layer of the sixth transistor, the seventh via exposes an active layer of the seventh transistor, the eighth via exposes an active layer of the eighth transistor, the ninth via exposes an active layer of the ninth transistor, and the tenth via exposes an active layer of the tenth transistor;
    the source electrode and the drain electrode of the first transistor are electrically connected with the active layer of the first transistor through the first via, the source electrode and the drain electrode of the second transistor are electrically connected with the active layer of the second transistor through the second via, the source electrode and the drain electrode of the third transistor are electrically connected with the active layer of the third transistor through the third via, the source electrode and the drain electrode of the fourth transistor are electrically connected with the active layer of the fourth transistor through the fourth via, the source electrode and the drain electrode of the fifth transistor are electrically connected with the active layer of the fifth transistor through the fifth via, the source electrode and the drain electrode of the sixth transistor are electrically connected with the active layer of the sixth transistor through the sixth via, the source electrode and the drain electrode of the seventh transistor are electrically connected with the active layer of the seventh transistor through the seventh via, the source electrode and the drain electrode of the eighth transistor are electrically connected with the active layer of the eighth transistor through the eighth via, the source electrode and the drain electrode of the ninth transistor are electrically connected with the active layer of the ninth transistor through the ninth via, and the source electrode and the drain electrode of the tenth transistor are electrically connected with the active layer of the tenth transistor through the tenth via.

15. The display substrate according to claim 8, wherein the display substrate further comprises: an eleventh via to a sixteenth via penetrating the second insulation layer and the third insulation layer;

the eleventh via exposes the gate electrode of the first transistor, the twelfth via exposes the gate electrode of the second transistor, the thirteenth via exposes the gate electrode of the fourth transistor, the fourteenth via exposes the gate electrode of the fifth transistor, the fifteenth via exposes the gate electrode of the seventh transistor, and the sixteenth via exposes the first electrode plate of the third capacitor;

the source electrode of the second transistor and one clock signal line are electrically connected with the gate electrode of the first transistor through the eleventh via, the drain electrode of the first transistor is electrically connected with the gate electrode of the second transistor through the twelfth via, the source electrode of the sixth transistor and another clock signal line are electrically connected with the gate electrode of the fourth transistor through the thirteenth via, the drain electrode of the third transistor is electrically connected with the gate electrode of the fifth transistor through the fourteenth via, and the drain electrode of the seventh transistor and another clock signal line are electrically connected with the first electrode plate of the third capacitor through the sixteenth via.

16. The display substrate according to claim 8, wherein the display substrate further comprises: a seventeenth via to a twenty-first via disposed on the third insulation layer;

the seventeenth via exposes the second electrode plate of the first capacitor, the eighteenth via exposes the second electrode plate of the second capacitor, the nineteenth via exposes the second electrode plate of the third capacitor, the twentieth via exposes a first connection portion of the output signal line, and the twenty-first via exposes a fourth connection portion of the output signal line;

the drain electrode of the sixth transistor is electrically connected with the second electrode plate of the first capacitor through the seventeenth via, the source electrode of the sixth transistor is electrically connected with the second electrode plate of the second capacitor through the eighteenth via, the drain electrode of the ninth transistor is electrically connected with the second electrode plate of the third capacitor through the nineteenth via, the source electrode of the ninth transistor and the drain electrode of the tenth transistor are electrically connected with the output signal line through the twentieth via, and the connection electrode is electrically connected with the output signal line through the twenty-first via;

a quantity of seventeenth vias is multiple, and the multiple seventeenth vias are arranged along the first direction;

a quantity of eighteenth vias is multiple, and the multiple eighteenth vias are arranged along the first direction;

a quantity of nineteenth vias is multiple, and the multiple nineteenth vias are arranged along a second direction;

a quantity of twentieth vias is multiple, and the multiple twentieth vias are arranged along the first direction.

17. A display apparatus, comprising a display substrate according to claim 1.

18. A preparation method of a display substrate, configured to prepare a display substrate according to claim 1, wherein the method comprises:

providing an underlay substrate;

forming a drive circuit and a first power supply line located in a non-display region on the underlay substrate; wherein the drive circuit comprises a first capacitor, a second capacitor, and a third capacitor; the first capacitor and the third capacitor are arranged along a first direction, the second capacitor and the third capacitor are respectively located on both sides of the first capacitor, the second capacitor is located on one side of the first capacitor close to a display region, and one electrode plate of the third capacitor is electrically connected with the first power supply line;

the first power supply line extends along the first direction, and an orthographic projection of the first capacitor on the underlay substrate is at least partially overlapped with an orthographic projection of the first power supply line on the underlay substrate.

19. The method according to claim 18, wherein the drive circuit comprises: multiple shift registers, wherein each shift register comprises multiple transistors and a first capacitor to a third capacitor, and the forming the drive circuit and the first power supply line located in the non-display region on the underlay substrate comprises:

forming a semiconductor layer on the underlay substrate, wherein the semiconductor layer comprises active layers of multiple transistors;

sequentially forming a first insulation layer and a first metal layer on the semiconductor layer, wherein the first metal layer comprises gate electrodes of the multiple transistors, a first electrode plate of the first capacitor, a first electrode plate of the second capacitor, and a first electrode plate of the third capacitor;

sequentially forming a second insulation layer and a second metal layer on the first metal layer, wherein the second metal layer comprises a second electrode plate of the first capacitor, a second electrode plate of the second capacitor, a second electrode plate of the third capacitor, and an output signal line; and sequentially forming a third insulation layer and a third metal layer on the second metal layer, wherein the third metal layer comprises source electrodes of the multiple transistors, drain electrodes of the multiple transistors, the first power supply line, a second power supply line, a first clock signal line, a second clock signal line, an initial signal line, and a connection electrode.

\* \* \* \* \*

UNITED STATES PATENT AND TRADEMARK OFFICE
CERTIFICATE OF CORRECTION

PATENT NO. : 12,165,584 B2  
APPLICATION NO. : 17/912061  
DATED : December 10, 2024  
INVENTOR(S) : Junxiu Dai and Lu Bai Page 1 of 1

It is certified that error appears in the above-identified patent and that said Letters Patent is hereby corrected as shown below:

On the Title Page

Below item (86) The 371 (c) Date should be September 16, 2022.

Signed and Sealed this  
Tenth Day of June, 2025

Coke Morgan Stewart  
*Acting Director of the United States Patent and Trademark Office*